United States Patent [19]
Kokubun

[11] Patent Number: 6,124,613
[45] Date of Patent: Sep. 26, 2000

[54] SOI-MOS FIELD EFFECT TRANSISTOR THAT WITHDRAWS EXCESS CARRIER THROUGH A CARRIER PATH SILICON LAYER

[75] Inventor: Tetsuya Kokubun, Tokyo, Japan

[73] Assignee: NEC Corporation, Tokyo, Japan

[21] Appl. No.: 09/071,152

[22] Filed: May 4, 1998

[30] Foreign Application Priority Data

May 2, 1997 [JP] Japan ..................................... 9-130329

[51] Int. Cl.$^7$ ................................................. H01L 29/786
[52] U.S. Cl. ........................................... 257/347; 257/351
[58] Field of Search ..................................... 257/347–351

[56] References Cited

U.S. PATENT DOCUMENTS 5,079,605  1/1992  Blake ....................................... 257/347

*Primary Examiner*—David Hardy
*Attorney, Agent, or Firm*—McGinn & Gibb, PC

[57] ABSTRACT

A silicon-on-insulator structure in a field effect transistor is formed on an insulation region. A body region of a first conductivity type is selectively formed on an insulation region. A diffusion region of a second conductivity type is selectively formed on the insulation region and in one side of the body region. An isolation layer is selectively formed on the insulation region and is bounded with the diffusion region so that the diffusion region is positioned between the body region and the isolation layer. A body contact region of the first conductivity type is selectively formed on the insulation region and is bounded with the isolation layer so that the body contact region is isolated by the isolation layer from the diffusion region. At least a carrier path silicon layer of the first conductivity type is selectively formed on the insulation region so that the carrier path silicon layer extends in contact directly with the body contact region, the diffusion region, the isolation layer and the body region. An anti-silicidation layer made of a material which exhibits no silicidation reaction with a metal under a heat treatment does extend over at least both the selected part of the carrier path silicon layer and a boundary portion of the diffusion region, which is bounded to and in the vicinity of the selected part of the carrier path silicon layer. A silicide layer with the metal is selectively formed so as to be separated from at least the selected part of the carrier path silicon layer, so that the body region and the body contact region are electrically connected to each other through the carrier path silicon layer, and further so that the diffusion region is electrically isolated from the carrier path silicon layer and from the body region as well as from the body contact region, whereby any excess carriers generated in the body region are allowed to be withdrawn through the carrier path silicon layer to the body contact region.

61 Claims, 13 Drawing Sheets

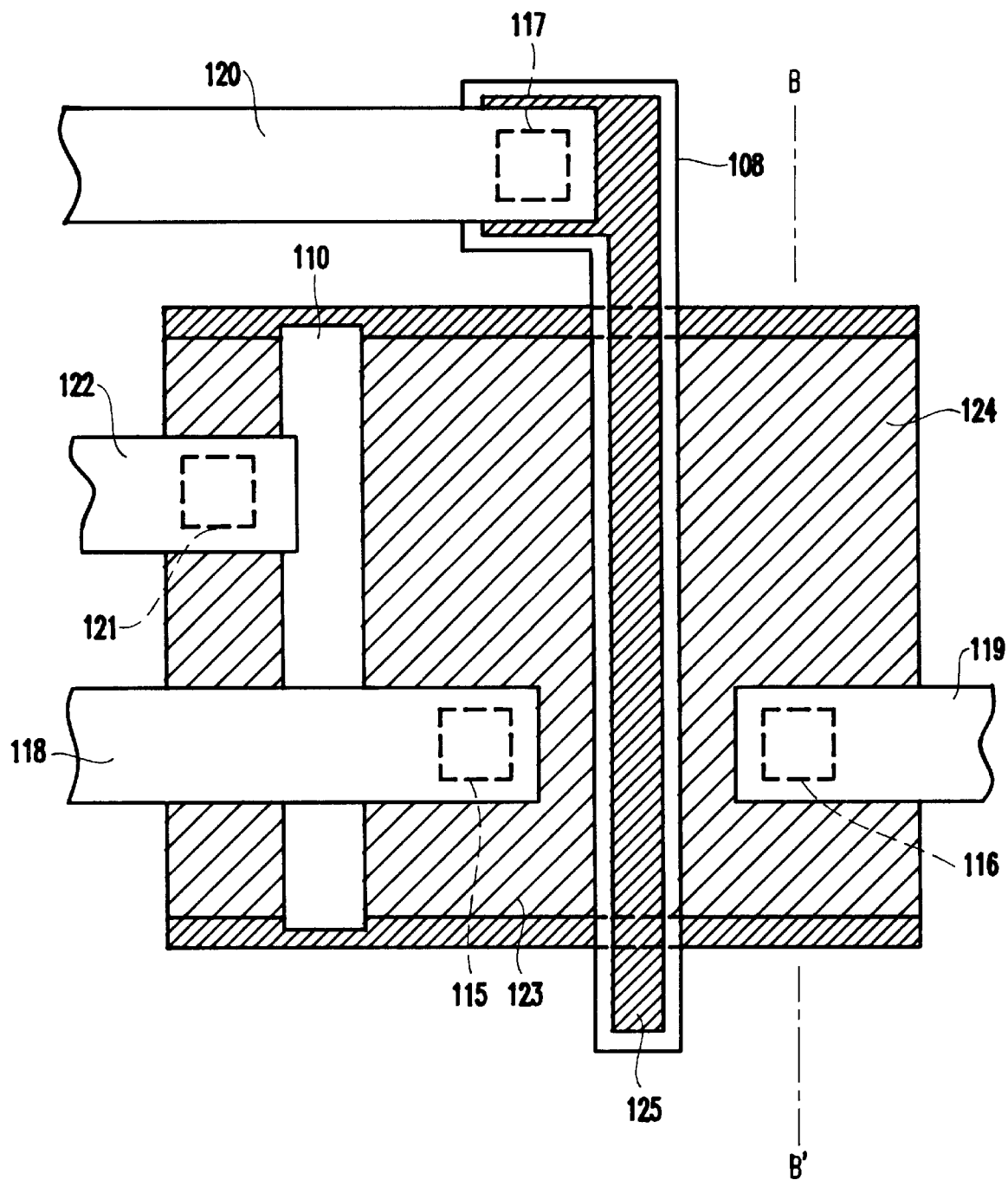

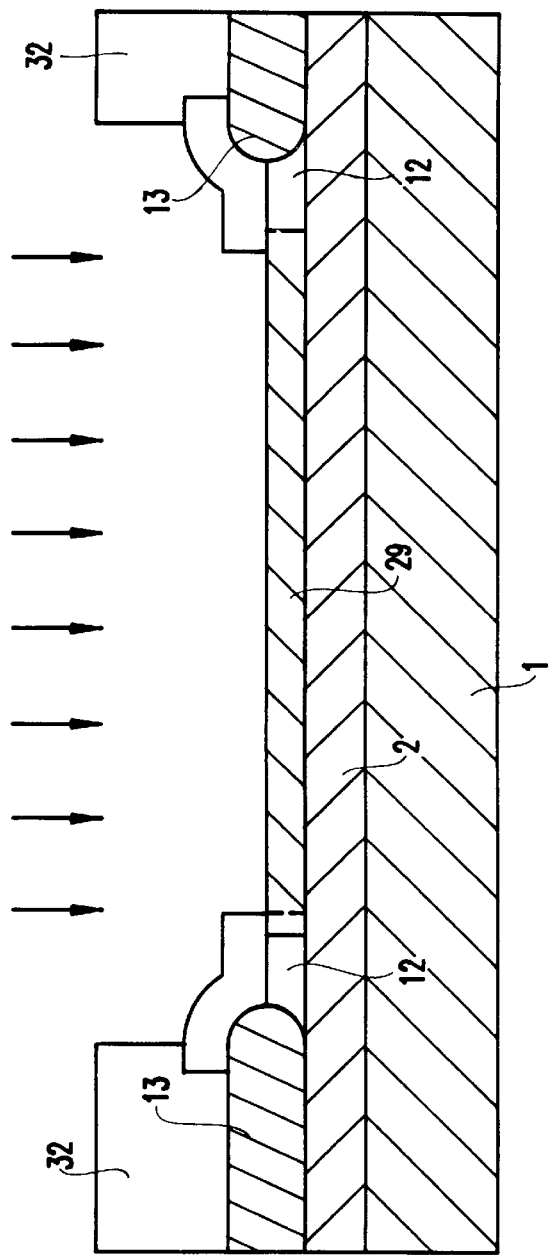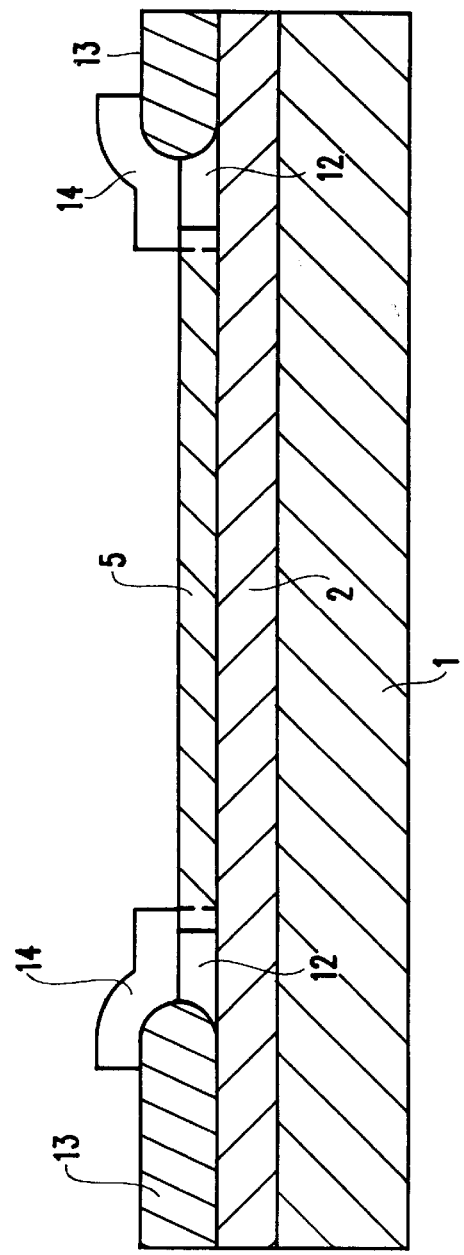

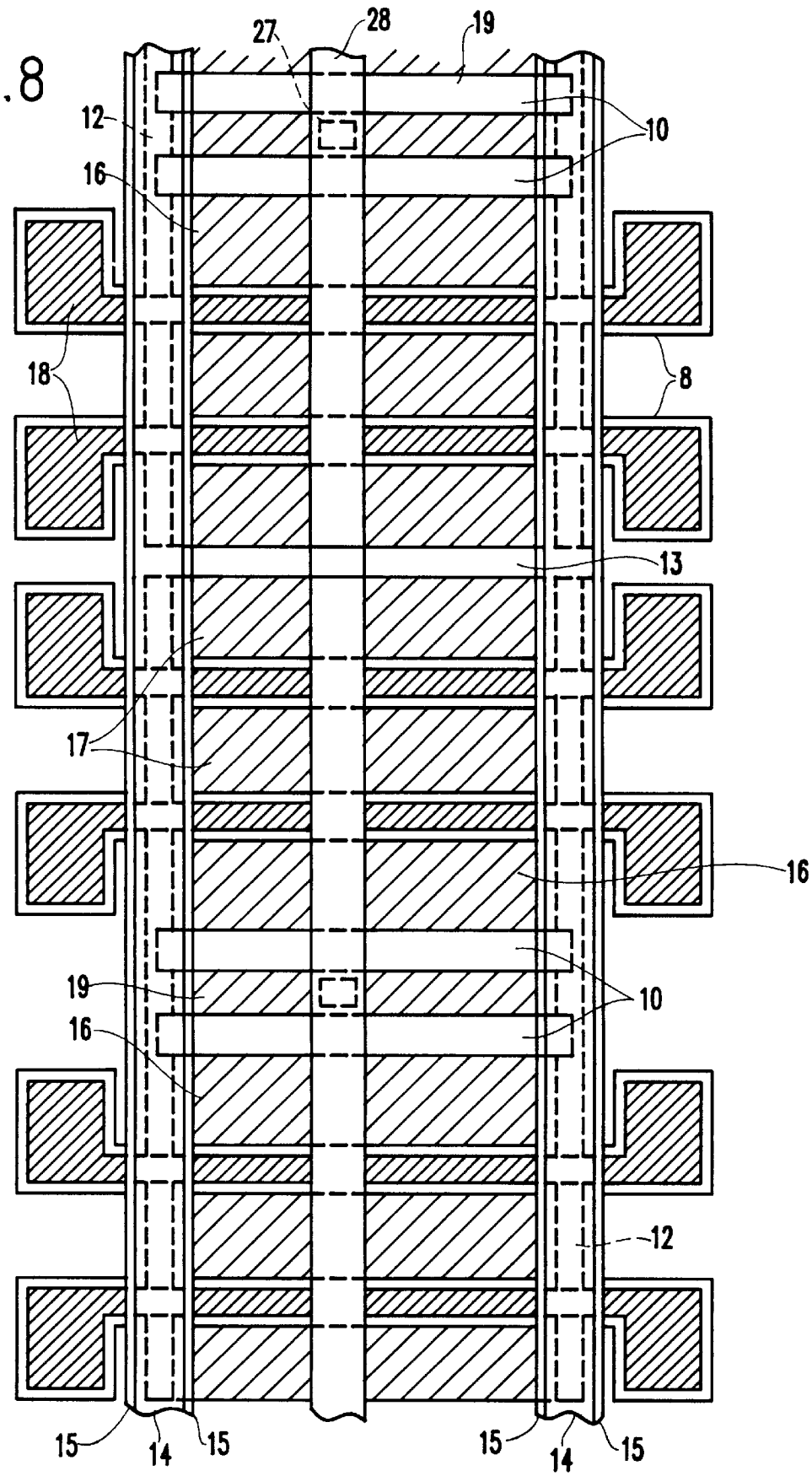

6,124,613

SOI-MOS FIELD EFFECT TRANSISTOR THAT WITHDRAWS EXCESS CARRIER THROUGH A CARRIER PATH SILICON LAYER

BACKGROUND OF THE INVENTION

The present invention relates to a SOI-MOS field effect transistor and a method of forming the same.

A silicon-on-insulator structure comprises a single crystal silicon layer provided on an insulation layer and may be formed by a separation by implantation oxygen method or a method of bonding silicon substrates. A MOS field effect transistor is formed in the single crystal silicon layer. The SOI-MOS field effect transistor may be classified into two types in view of the thickness of the single crystal silicon layer. The first one is a thick film SOI-MOS field effect transistor and the second one is a thin film SOI-MOS field effect transistor. The single crystal silicon layer of the thick film SOI-MOS field effect transistor has a thickness, for example, not less than 1000 nanometers. The single crystal silicon layer of the thin film SOI-MOS field effect transistor has a thickness in the range of, for example, about 30 nanometers to about 200 nanometers.

The thin film SOI-MOS field effect transistor is superior in low parasitic capacitance, low junction leakage current, complete device isolation, and anti-soft error properties, for which reason the thin film SOI-MOS field effect transistor is suitable for high speed performance, low power consumption, high density integration and high reliability.

The thin film SOI-MOS field effect transistor is, however, engaged with a serious problem with floating-body effects. The thin film SOI structure makes it difficult to fix a potential of a channel region. This allows that excess carriers generated by an impact ionization phenomenon in the vicinity of the drain region are accumulated in a lower region of the body region. This accumulation of the excess carrier in the body region causes the floating-body effects such as a drop of drain breakdown voltage and kink effects on current-voltage characteristics.

In order to settle the above problems with the substrate floating effects, it had been proposed to withdraw the excess carriers from the body region through a body contact region which is electrically connected to the body region. FIG. 1 is a fragmentary plane view illustrative of this first conventional SOI-MOS field effect transistor having a body contact region electrically connected to the channel region for withdrawing the excess carriers from the body region through the body contact region. FIG. 2A is a fragmentary cross sectional elevation view illustrative of the first conventional SOI-MOS field effect transistor taken along a B-B' line of FIG. 1. FIG. 2B is a fragmentary cross sectional elevation view illustrative of the first conventional SOI-MOS field effect transistor taken along a C-C' line of FIG. 1.

The first conventional SOI-MOS field effect transistor is provided which comprises the following elements. A buried silicon oxide layer 102 is provided on a silicon substrate 101. A monocrystal silicon layer is provided on the buried silicon oxide layer 102 to form a silicon-on-insulator structure. The monocrystal silicon layer is surrounded by field oxide films 113. The monocrystal silicon layer further comprises the following parts. A body region 103 of a first conductivity type is selectively formed on the buried silicon oxide layer 102. A first diffusion region 104 of a second conductivity type acts as one of source and drain regions and is selectively formed on the buried silicon oxide layer 102 and in one side of the body region 103. A second diffusion region 105 of the second conductivity type acts as another one of the source and drain regions and is selectively formed on the buried silicon oxide layer 102 and in an opposite side of the body region 103 so that the channel region 103 is positioned between the first and second diffusion regions 104 and 105. An isolation layer 110 is selectively formed on the buried silicon oxide layer 102 and is bounded with the first diffusion region 104 so that the first diffusion region 104 is positioned between the body region 103 and the isolation layer 110. A body contact region 111 of the first conductivity type is selectively formed on the buried silicon oxide layer 102 and is bounded with the isolation layer 110 so that the body contact region 111 is isolated by the isolation layer 110 from the first diffusion region 104. A pair of carrier path regions 112 of the first conductivity type is selectively formed on the buried silicon oxide layer 102 so that the carrier path regions 112 extend along first opposite sides of the monocrystal silicon layer in a channel length direction, where the first opposite sides are distanced from each other in a channel width direction along B-B' line of FIG. 1 perpendicular to the channel length direction along C-C' line. The carrier path regions 112 are bounded with the field oxide films 113, whereby each of the carrier path regions 112 is in contact directly with the body contact region 111, the first and second diffusion regions 104 and 105, the isolation layer 110 and the body region 103. A gate insulation film 106 is selectively provided on the body region 103. A gate electrode 107 is provided on the gate insulation film 106 and over the body region 103. Lightly doped silicon regions 109 of the second conductivity type having a lower impurity concentration than impurity concentrations of the first and second diffusion regions 104 and 105 are provided on the buried silicon oxide layer 102 and between the body region 103 and the first diffusion region 104 and between the body region 103 and the second diffusion region 105. Side wall insulation films 108 are provided on opposite side walls of the gate electrode 107 and on top surfaces of the lightly doped silicon regions 109. An inter-layer insulator 114 covers the gate electrode 107, the first and second diffusion regions 104 and 105, the isolation layer 110, the body contact region 111, and the carrier path regions 112. A contact layer 121 is formed in a contact hole formed in the inter-layer insulator 114 and over the body contact region 111 so that the contact layer 121 is in contact with the body contact region 111. An interconnection layer 122 extends over the inter-layer insulator 114 and also is connected with the contact layer 121 so that the interconnection layer 122 is electrically connected through the contact layer 121 to the body contact region 111.

The body region 103 mid the body contact region 111 are electrically connected to each other through the carrier path regions 112, The first and second diffusion regions 104 and 105 are electrically isolated by p-n junctions from the carrier path regions 112 and from the body region 103 as well as from the body contact region 111. Any excess carriers generated in the body region 103 due to an impact ionization phenomenon are allowed to be withdrawn through the carrier path regions 112, the body contact region 111 and the contact layer 121 to the interconnection layer 122. The above carrier path structure makes the SOI-MOS field effect transistor free from the various problems caused by the floating-body effects.

The above body contact region 111 of the first conductivity type has a higher impurity concentration than an impurity concentration of the body region 103. The carrier path layers 112 of the first conductivity type have an impurity concentration which is equal to or higher than an impurity concentration of the body region 103 but is lower than an impurity concentration of the body contact region 111.

The isolation layer 110 isolates the body contact region 111 of the first conductivity type from the first diffusion layer 104 of the second conductivity type so as to makes the SOI-MOS field effect transistor free from the problem with a drop of junction break down voltage.

In the above SOI-MOS field effect transistor, the reduction in thickness of the single crystal silicon layer provided on the buried silicon layer improves sub-threshold characteristics and suppresses the short channel effects. The reduction in thickness of the single crystal silicon layer provided on the buried silicon layer, however, raises problems with increase in resistance of the diffusion regions acting as the source and drain regions. The increase in resistance of the diffusion regions acting as the source and drain regions makes prevents the semiconductor integrated circuit from exhibiting the required high speed performance.

In order to settle the problem with increased resistance of the diffusion regions acting as the source/drain regions, it is effective to selectively form metal silicide layers in upper regions of the diffusion regions acting as the source/drain regions.

The source/drain diffusion regions with the metal silicide layers may usually be formed as follows.

After a gate electrode and source and drain regions have been formed in the normal or well known method, then a refractory metal layer or a noble metal layer is entirely formed by a sputtering method A heat treatment is carried out to cause a silicidation reaction of metal with silicon to form silicide layers on the surface regions of the source/drain diffusion regions and the gate electrode by use of the self-alignment techniques. Namely, self-aligned silicide layers or salicide layers are selectively formed on the source/drain diffusion regions and the gate electrode. Unreacted parts of the metal layer are removed.

If the above formation method for the metal silicide layers on the gate electrode and the source/drain diffusion regions is applied to the above described SOI-MOS field effect transistor shown in FIGS. 1, 2A and 2B, then the following serious problems are raised.

As illustrated in FIGS. 3 and 4, if the metal layer is entirely deposited which covers the field oxide film 113, the carrier path regions 112, the body contact region 111, the isolation layer 110, the source and drain diffusion regions 104 and 105, the side wall oxide films 108 and the gate electrode 107 and subsequently a heat treatment is carried out to cause the silicidation reaction of metal with silicon, then a silicide layer 123, 124 is formed which extends over the body contact region 111, the carrier path regions 112, the source drain diffusion regions 104 and 105 and the gate electrode 107. The unreacted parts of the metal layer are then removed. However, the source and drain diffusion regions 104 and 105 of the second conductivity type are electrically connected through the metal suicide layer 123, 124 to the carrier path regions 112 of the first conductivity type and also to the body contact region 111 of the first conductivity type. Since the body region 103 of the first conductivity type is electrically connected to the carrier path regions 112 of the first conductivity type, then the source and drain diffusion regions 104 and 105 of the second conductivity type are also electrically connected through the silicide layer 123, 124 and the carrier path region 112 to the body region 103. The metal silicide layer 123, 124 provides a short circuit between the first conductivity type silicon regions such as the body region 103 and the body contact region 111 and the second conductivity type silicon regions such as the source/drain diffusion regions 104 and 105. As a result, the SOI-MOS field effect transistor shown in FIGS. 3 and 4 could no longer exhibit any required functions.

In the above circumstances, it had been required to develop a novel SOI-MOS field effect transistor free from the above problems.

SUMMARY OF THE INVENTION

Accordingly, it is an object of the present invention to provide a novel SOI-MOS field effect transistor free from the above problems.

It is a farther object of the present invention to provide a novel SOI-MOS field effect transistor free from the problems with the substrate body-floating effects.

It is a still further object of the present invention to provide a novel SOI-MOS field effect transistor capable of withdrawing excess carriers from the body region through the carrier path region to the body contact region.

It is yet a further object of the present invention to provide a novel SOI-MOS field effect transistor having reduced electrical resistances of the source/drain diffusion regions.

It is a further more object of the present invention to provide a novel SOI-MOS field effect transistor exhibiting improved high speed performances.

It is still more object of the present invention to provide a novel SOI-MOS field effect transistor free of any short circuit between the body contact region and the source/drain diffusion regions.

It is moreover object of the present invention to provide a novel gate array structure having an array of SOI-MOS field effect transistors free from the above problems.

It is another object of the present invention to provide a novel gate array structure having an array of SOI-MOS field effect transistors free from the problems with the floating-body effects.

It is still another object of the present invention to provide a novel gate array structure having an array of SOI-MOS field effect transistors capable of withdrawing excess carriers from the channel region through the carrier path region to the body contact region.

It is yet another object of the present invention to provide a novel gate array structure having an array of SOI-MOS field effect transistors having reduced electrical resistances of the source/drain diffusion regions.

It is further another object of the present invention to provide a novel gate array structure having an array of SOI-MOS field effect transistors exhibiting improved high speed performances.

It is an additional object of the present invention to provide a novel gate array structure having an array of SOI-MOS field effect transistors free of any short circuit between the body contact region and the source/drain diffusion regions.

It is a still additional object of the present invention to provide a novel method of forming an SOI-MOS field effect transistor free from the above problems.

The above and other objects, features and advantages of the present invention will be apparent from the following descriptions.

The present invention provides a silicon-on-insulator structure in a field effect transistor. The structure is formed on an insulation region. A body region of a first conductivity type is selectively formed on an insulation region, A diffusion region of a second conductivity type is selectively formed on the insulation region and in one side of the channel region. An isolation layer is selectively formed on the insulation region and is bounded with the diffusion region so that the diffusion region is positioned between the body region and the isolation layer. A body contact region of the first conductivity type is selectively formed on the insulation region and is bounded with the isolation layer so that the body contact region is isolated by the isolation layer from the diffusion region. At least a carrier path silicon layer of the first conductivity type is selectively formed on the insulation region so that the carrier path silicon layer extends in contact directly with the body contact region, the diffusion region, the isolation layer and the body region. An antisilicidation layer made of a material which exhibits no silicidation reaction with a metal under a heat treatment does extend over at least both the selected part of the carrier path silicon layer and a boundary portion of the diffusion region, which is bounded to and in the vicinity of the selected part of the carrier path silicon layer. A silicide layer with the metal is selectively formed so as to be separated from at least the selected part of the carrier path silicon layer, so that the body region and the body contact region are electrically connected to each other through the carrier path silicon layer, and further so that the diffusion region is electrically isolated from the carrier path silicon layer and from the body region as well as from the body contact region, whereby any excess carriers generated in the body region are allowed to be withdrawn through the carrier path silicon layer to the body contact region.

BRIEF DESCRIPTION OF THE DRAWINGS

Preferred embodiments according to the present invention will be described in detail with reference to the accompanying drawings.

FIG. 3 is a fragmentary plane view illustrative of the second conventional SOI-MOS field effect transistor.

FIGS. 7A through 7K are fragmentary cross sectional elevation views illustrative of novel SOI-MOS field effect transistors taken along a B-B' line of FIG. 5 in sequential steps involved in a novel fabrication method in a first embodiment in accordance with the present invention.

FIG. 8 is a fragmentary plane view illustrative of a gate array structure integrated with a plurality of novel SOI-MOS field effect transistors in a second embodiment in accordance with the present invention.

DISCLOSURE OF THE INVENTION

Figure 1:
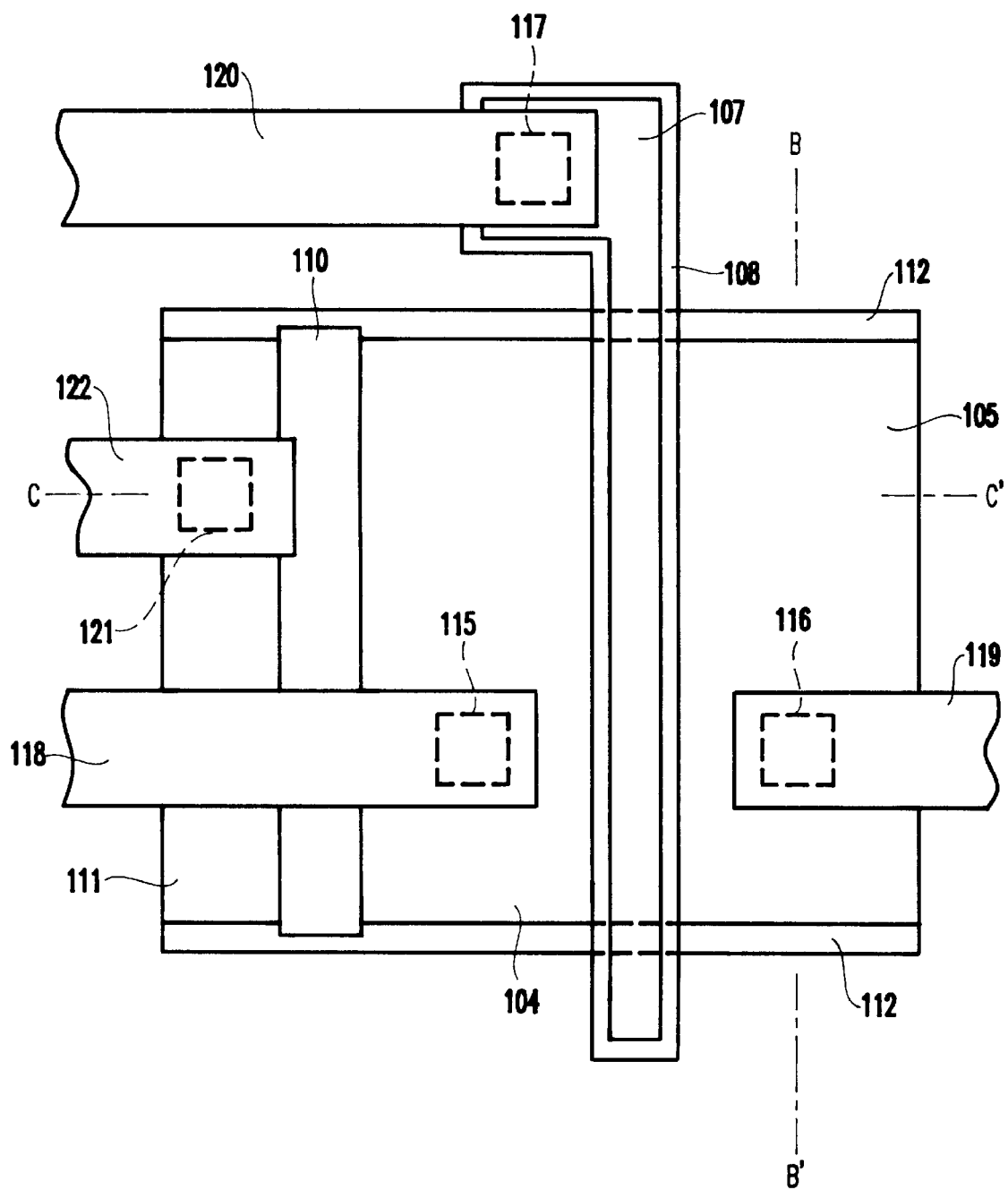
FIG. 1 is a fragmentary plane view illustrative of the first conventional SOI-MOS field effect transistor.
Figure 2A:
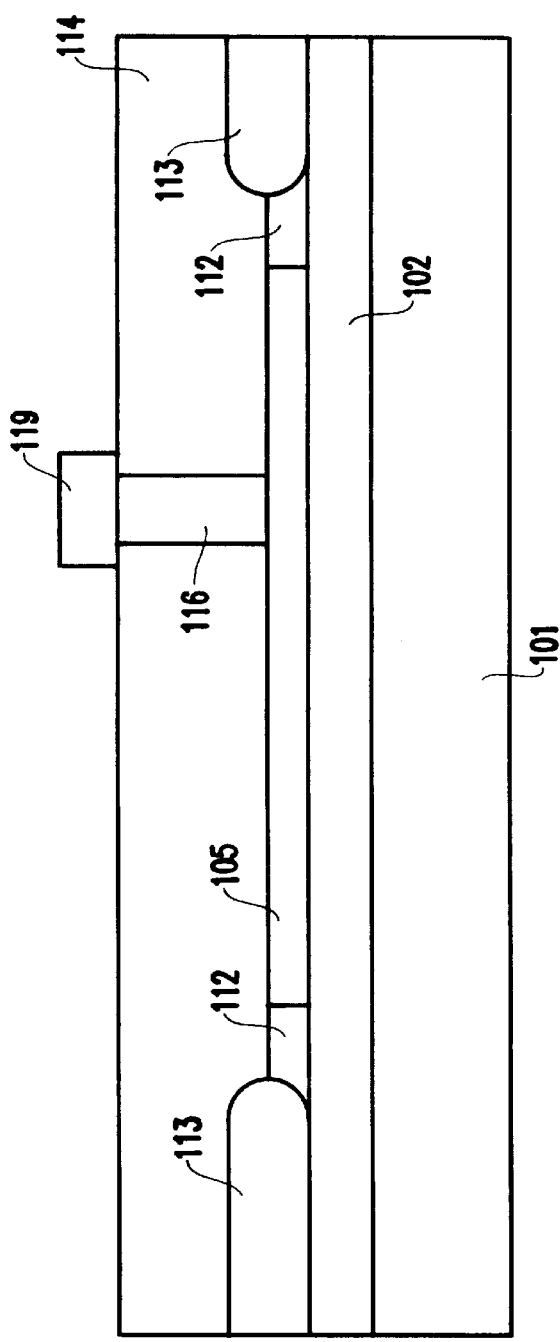
FIG. 2A is a fragmentary cross sectional elevation view illustrative of the first conventional SOI-MOS field effect transistor taken along a B-B' line of FIG. 1.
Figure 2B:
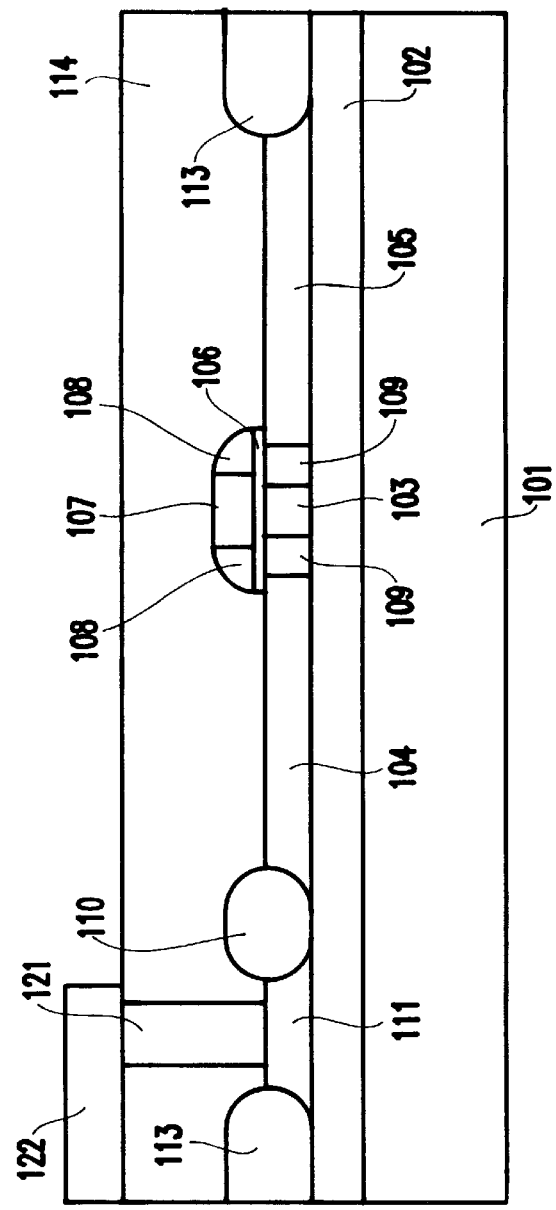
FIG. 2B is a fragmentary cross sectional elevation view illustrative of the first conventional SOI-MOS field effect transistor taken along a C-C' line of FIG. 1.
Figure 4:
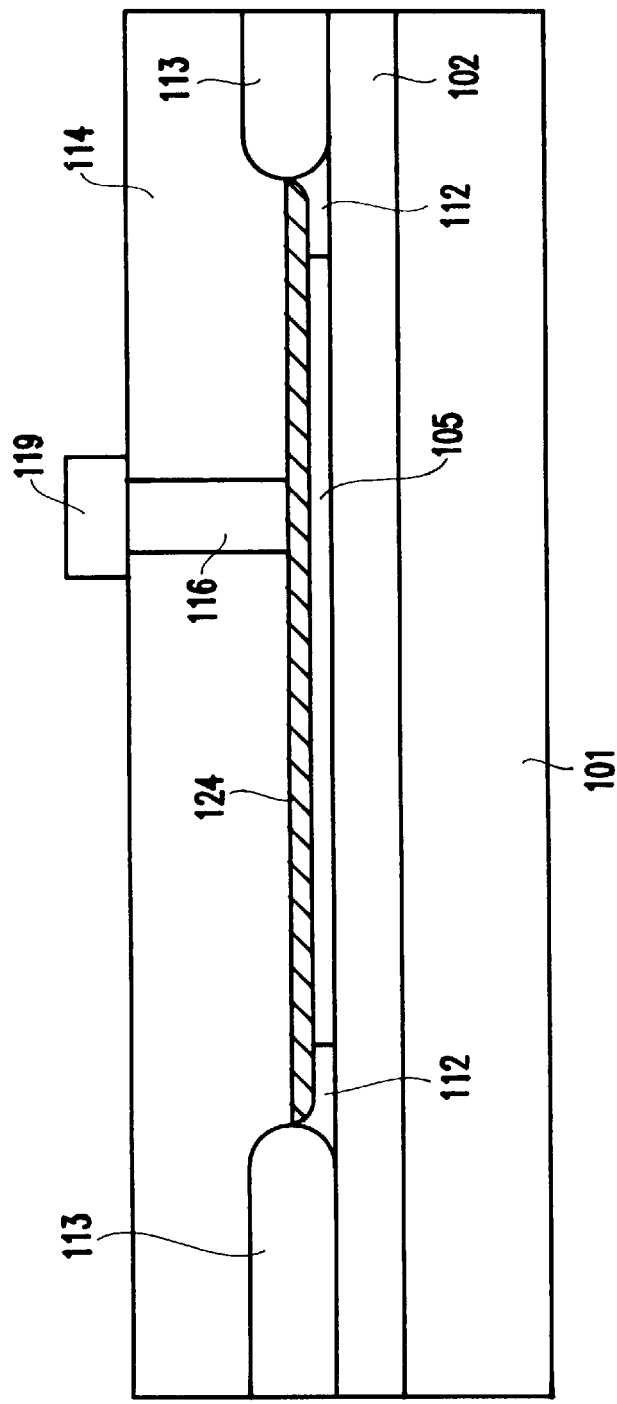
FIG. 4 is a fragmentary cross sectional elevation view illustrative of the second conventional SOI-MOS field effect transistor taken along a B-B' line of FIG. 3.

The first present invention provides a silicon-on-insulator structure in a field effect transistor. The structure is formed on an insulation region. A body region of a first conductivity type is selectively formed on an insulation region. A diffusion region of a second conductivity type is selectively formed on the insulation region and in one side of the channel region. An isolation layer is selectively formed on the insulation region and is bounded with the diffusion region so that the diffusion region is positioned between the channel region and the isolation layer. A body contact region of the first conductivity type is selectively formed on the insulation region and is bounded with the isolation layer so that the body contact region is isolated by the isolation layer from the diffusion region. At least a carrier path silicon layer of the first conductivity type is selectively formed on the insulation region so that the carrier path silicon layer extends in contact directly with the body contact region, the diffusion region, the isolation layer and the body region. An antisilicidation layer made of a material which exhibits no silicidation reaction with a metal under a heat treatment does extend over at least both the selected part of the carrier path silicon layer and a boundary portion of the diffusion region, which is bounded to and in the vicinity of the selected part of the carrier path silicon layer. A silicide layer with the metal is selectively formed so as to be separated from at least the selected part of the carrier path silicon layer, so that the body region and the body contact region are electrically connected to each other through the carrier path silicon layer, and further so that the diffusion region is electrically isolated from the carrier path silicon layer and from the body region as well as from the body contact region, whereby any excess carriers generated in the body region are allowed to be withdrawn through the carrier path silicon layer to the body contact region.

It is preferable to further provide a gate insulation film being selectively provided on the body region; and a gate electrode provided on the gate insulation film and over the body region. In this case, it is also preferable to further provide a lightly doped silicon region of the second conductivity type having a lower impurity concentration than an impurity concentration of the diffusion region. The lightly doped silicon region is provided on the insulation region and between the body region and the diffusion region, whereby the carrier path silicon layer is partially in contact with the lightly doped silicon region but is electrically isolated from the lightly doped silicon region. In this case, it is also preferable to further provide a side wall insulation film being provided on a side wall of the gate electrode and on a top surface of the lightly doped silicon region.

It is also preferable that the silicide layer is formed on both the body contact region and the diffusion region, and the silicide layer is separated from at least the selected part of the carrier path silicon layer, so that the body region and the body contact region are electrically connected to each other through the carrier path silicon layer, and so that the diffusion region is electrically isolated from the carrier path silicon layer and from the body region as well as from the body contact region, whereby any excess carriers generated in the body region are allowed to be withdrawn through the carrier path silicon layer to the body contact region, It is also preferable that the silicide layer is formed on both the body contact region and the diffusion region as well as on the carrier path silicon layer except for the selected part thereof so that the silicide layer is separated from the selected part of the carrier path silicon layer, whereby the body region and the body contact region are electrically connected to each other through the carrier path silicon layer, and whereby the diffusion region is electrically isolated from the carrier path silicon layer and from the body region as well as from the body contact region, resulting in that any excess carriers generated in the body region are allowed to be withdrawn through the carrier path silicon layer to the body contact region.

It is also preferable that the silicide layer is formed to be separated from any parts of the carrier path silicon layer, so that the body region and the body contact region are electrically connected to each other through the carrier path silicon layer, and so that the diffusion region is electrically isolated from the carrier path silicon layer and from the body region as well as from the body contact region, whereby any excess carriers generated in the channel region are allowed to be withdrawn through the carrier path silicon layer to the body contact region.

It is also preferable that the anti-silicidation layer extends over both an entire part of the carrier path silicon layer and boundary portions of the diffusion region and body contact regions, which are bounded to and in the vicinity of the carrier path silicon layer, so that the silicide layer is selectively formed so as to be separated from the entire part of the carrier path silicon layer, and so that the body region and the body contact region are electrically connected to each other through the carrier path silicon layer, and further so that the diffusion region is electrically isolated from the carrier path silicon layer and from the body region as well as from the body contact region, whereby any excess carriers generated in the body region are allowed to be withdrawn through the carrier path silicon layer to the body contact region.

It is also preferable that the anti-silicidation layer is made of insulator. In this case, it is also preferable that the insulator is silicon dioxide.

The second present invention provides a silicon-on-insulator structure in a field effect transistor. The structure is formed on an insulation region. A body region of a first conductivity type is selectively formed on the insulation region. A diffusion region of a second conductivity type is selectively formed on the insulation region and in one side of the channel region. An isolation layer is selectively formed on the insulation region and is bounded with the diffusion region so that the diffusion region is positioned between the body region and the isolation layer. A body contact region of the first conductivity type is selectively formed on the insulation region and is bounded with the isolation layer so that the body contact region is isolated by the isolation layer from the diffusion region. At least a carrier path silicon layer of the first conductivity type is selectively formed on the insulation region so that the carrier path silicon layer extends in contact directly with the body contact region, the diffusion region, the isolation layer and the body region. At least a silicide layer is selectively formed on at least the diffusion region and also is separated from at least a selected part of the carrier path silicon layer, where the selected part of the carrier path silicon layer is in contact directly with the diffusion region, so that the channel region and the body contact region are electrically connected to each other through the carrier path silicon layer, and so that the diffusion region is electrically isolated from the carrier path silicon layer and from the body region as well as from the body contact region, whereby any excess carriers generated in the body region are allowed to be withdrawn through the carrier path silicon layer to the body contact region.

It is preferable to provide a gate insulation film being selectively provided on the body region and a gate electrode provided on the gate insulation film and over the body region. In this case, it is also preferable to further provide a lightly doped silicon region of the second conductivity type having a lower impurity concentration than an impurity concentration of the diffusion region. The lightly doped silicon region is provided on the insulation region and between the body region and the diffusion region, whereby the carrier path silicon layer is partially in contact with the lightly doped silicon region but is electrically isolated from the lightly doped silicon region. In this case, it is also preferable to further provide a side wall insulation film being provided on a side wall of the gate electrode and on a top surface of the lightly doped silicon region.

It is also preferable that the silicide layer is formed on both the body contact region and the diffusion region, and the silicide layer is separated from at least the selected part of the carrier path silicon layer, so that the body region and the body contact region are electrically connected to each other through the carrier path silicon layer, and so that the diffusion region is electrically isolated from the carrier path silicon layer and from the body region as well as from the body contact region, whereby any excess carriers generated in the channel region are allowed to be withdrawn through the carrier path silicon layer to the body contact region.

It is also preferable that the silicide layer is formed on both the body contact region and the diffusion region as well as on the carrier path silicon layer except for the selected part thereof so that the silicide layer is separated from the selected part of the carrier path silicon layer, whereby the channel and region and the body contact region are electrically connected to each other through the carrier path silicon layer, and whereby the diffusion region is electrically isolated from the carrier path silicon layer and from the channel region as well as from the body contact region, resulting in that any excess carriers generated in the body region are allowed to be withdrawn through the carrier path silicon layer to the body contact region.

It is also preferable that the silicide layer is formed to be separated from any parts of the carrier path silicon layer, so that the body region and the body contact region are electrically connected to each other through the carrier path silicon layer, and so that the diffusion region is electrically isolated from the carrier path silicon layer and from the channel region as well as from the body contact region, whereby any excess carriers generated in the channel region are allowed to be withdrawn through the carrier path silicon layer to the body contact region.

It is also preferable to provide an anti-silicidation layer made of a material which exhibits no silicidation reaction with a metal under a beat treatment. The anti-silicidation layer extends over at least both the selected part of the carrier path silicon layer and a boundary portion of the diffusion region, which is bounded to and in the vicinity of the selected part of the carrier path silicon layer, so that the silicide layer is selectively formed so as to be separated from at least the selected part of the carrier path silicon layer, and so that the body region and the body contact region are electrically connected to each other through the carrier path silicon layer, and further so that the diffusion region is electrically isolated from the carrier path silicon layer and from the channel region as well as from the body contact region, whereby any excess carriers generated in the channel region are allowed to be withdrawn through the carrier path silicon layer to the body contact region.

It is also preferable to provide an anti-silicidation layer made of a material which exhibits no silicidation reaction with a metal under a heat treatment, the anti-silicidation layer extending over both an entire part of the carrier path silicon layer and boundary portions of the diffusion region and body contact regions, which are bounded to and in the vicinity of the carrier path silicon layer, so that the suicide layer is selectively formed so as to be separated from the entire part of the carrier path silicon layer, and so that the body region and the body contact region are electrically connected to each other through the carrier path silicon layer, and further so that the diffusion region is electrically isolated from the carrier path silicon layer and from the channel region as well as from the body contact region, whereby any excess carriers generated in the body region are allowed to be withdrawn through the carrier path silicon layer to the body contact region.

It is also preferable that the anti-silicidation layer is made of insulator.

The third present invention provides a silicon-on-insulator structure in a semiconductor device. The structure is formed on an insulation region. A first silicon region of a first conductivity type is selectively formed on the insulation region. A second silicon region of a second conductivity type is selectively formed on the insulation region and in one side of the first silicon region. An isolation layer is selectively formed on the insulation region and is bounded with the second silicon region so that the second silicon region is positioned between the first silicon region and the isolation layer. A third silicon region of the first conductivity type is selectively formed on the insulation region and is bounded with the isolation layer so that the third silicon region is isolated by the isolation layer from the second silicon region. At least a carrier path silicon layer of the first conductivity type is selectively formed on the insulation region so that the carrier path silicon layer extends in contact directly with the third silicon region, the second silicon region, the isolation layer and the first silicon region. An anti-silicidation layer made of a material which exhibits no silicidation reaction with a metal under a heat treatment does extend over at least both the selected part of the carrier path silicon layer and a boundary portion of the second silicon region, which is bounded to and in the vicinity of the selected part of the carrier path silicon layer. A silicide layer with the metal is selectively formed so as to be separated from at least the selected part of the carrier path silicon layer, so that the first and third silicon regions are electrically connected to each other through the carrier path silicon layer, and further so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is preferable to provide an insulation film being selectively provided on the first silicon region and a control electrode provided on the insulation film and over the first silicon region. In this case, it is also preferable to further provide a lightly doped silicon region of the second conductivity type having a lower impurity concentration than an impurity concentration of the second silicon region, and the lightly doped silicon region being provided on the insulation region and between the first silicon region and the second silicon region, whereby the carrier path silicon layer is partially in contact with the lightly doped silicon region but is electrically isolated from the lightly doped silicon region. In this case, it is also preferable to further provide a side wall insulation film being provided on a side wall of the control electrode and on a top surface of the lightly doped silicon region.

It is also preferable that the silicide layer is formed on both the third silicon region and the second silicon region, and the silicide layer is separated from at least the selected part of the carrier path silicon layer, so that the first and third silicon regions are electrically connected to each other through the carrier path silicon layer, and so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is also preferable that the silicide layer is formed on both the third silicon region and the second silicon region as well as on the carrier path silicon layer except for the selected part thereof so that the silicide layer is separated from the selected part of the carrier path silicon layer, whereby the first and third silicon regions are electrically connected to each other through the carrier path silicon layer, and whereby the second silicon region is electrically isolated from the carrier path silicon layer and from the first silicon region as well as from the third silicon region, resulting in that any excess carriers generated in the first silicon region are allowed to be withdrawn through the carrier path silicon layer to the third silicon region.

It is also preferable that the silicide layer is formed to be separated from any parts of the carrier path silicon layer, so that the first and third silicon regions are electrically connected to each other through the carrier path silicon layer, and so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is also preferable that the anti-silicidation layer extends over both an entire part of the carrier path silicon layer and boundary portions of the second and third silicon regions, which are bounded to and in the vicinity of the carrier path silicon layer, so that the silicide layer is selectively formed so as to be separated from the entire part of the carrier path silicon layer, and so that the first and third silicon regions are electrically connected to each other through the carrier path silicon layer, and further so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is also preferable that the anti-silicidation layer is made of insulator. In this case, it is also preferable that the insulator is silicon dioxide.

The fourth present invention provides a silicon-on-insulator structure in a semiconductor device. The structure is formed on an insulation region. A first silicon region of a first conductivity type is selectively formed on the insulation region. A second silicon region of a second conductivity type is selectively formed on the insulation region and in one side of the first silicon region. An isolation layer is selectively formed on the insulation region and is bounded with the second silicon region so that the second silicon region is positioned between the first silicon region and the isolation layer. A third silicon region of the first conductivity type is selectively formed on the insulation region and is bounded with the isolation layer so that the third silicon region is isolated by the isolation layer from the second silicon region.

At least a carrier path silicon layer of the first conductivity type is selectively formed on the insulation region so that the carrier path silicon layer extends in contact directly with the third silicon region, the second silicon region, the isolation layer and the first silicon region. At least a silicide layer is selectively formed on at least the second silicon region and also is separated from at least a selected part of the carrier path silicon layer, where the selected part of the carrier path silicon layer is in contact directly with the second silicon region, so that the first and third silicon regions are electrically connected to each other through the carrier path silicon layer, and so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is preferable to provide an insulation film being selectively provided on the first silicon region and a control electrode provided on the insulation film and over the first silicon region. In this case, it is also preferable to further provide a lightly doped silicon region of the second conductivity type having a lower impurity concentration than an impurity concentration of the second silicon region, and the lightly doped silicon region being provided on the insulation region and between the first silicon region and the second silicon region, whereby the carrier path silicon layer is partially in contact with the lightly doped silicon region but is electrically isolated from the lightly doped silicon region. In this case, it is also preferable to further provide a side wall insulation film being provided on a side wall of the control electrode and on a top surface of the lightly doped silicon region.

It is also preferable that the silicide layer is formed on both the third silicon region and the second silicon region, and the suicide layer is separated from at least the selected part of the carrier path silicon layer, so that the first and third silicon regions are electrically connected to each other through the carrier path silicon layer, and so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is also preferable that the silicide layer is formed on both the third silicon region and the second silicon region as well as on the carrier path silicon layer except for the selected part thereof so that the silicide layer is separated from the selected part of the carrier path silicon layer, whereby the first and third silicon regions are electrically connected to each other through the carrier path silicon layer, and whereby the second silicon region is electrically isolated from the carrier path silicon layer and from the first silicon region as well as from the third silicon region, resulting in that any excess carriers generated in the first silicon region are allowed to be withdrawn through the carrier path silicon layer to the third silicon region.

It is also preferable that the silicide layer is formed to be separated from any parts of the carrier path silicon layer, so that the first and third silicon regions are electrically connected to each other through the carrier path silicon layer, and so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is also preferable to provide an anti-silicidation layer made of a material which exhibits no silicidation reaction with a metal under a heat treatment The anti-silicidation layer extends over at least both the selected part of the carrier path silicon layer and a boundary portion of the second silicon region, which is bounded to and in the vicinity of the selected part of the carrier path silicon layer, so that the silicide layer is selectively formed so as to be separated from at least the selected part of the carrier path silicon layer, and so that the first and third silicon regions are electrically connected to each other through the carrier path silicon layer, and further so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region, In this case, it is also preferable to further provide an anti-silicidation layer made of a material which exhibits no silicidation reaction with a metal under a heat treatment. The anti-silicidation layer extends over both an entire part of the carrier path silicon layer and boundary portions of the second and third silicon regions, which are bounded to and in the vicinity of the carrier path silicon layer, so that the silicide layer is selectively formed so as to be separated from the entire part of the carrier path silicon layer, and so that the first and third silicon regions are electrically connected to each other through the carrier path silicon layer, and further so that the second silicon region is electrically isolated from the carrier path silicon layer and from the first silicon region as well as from the third silicon region, whereby any excess carriers generated in the first silicon region are allowed to be withdrawn through the carrier path silicon layer to the third silicon region.

It is preferable that the anti-silicidation layer is made of insulator.

The fifth present invention provides an SOI-MOS field effect transistor formed on a buried silicon oxide layer provided on a silicon substrate. A monocrystal silicon layer is provided on the buried silicon oxide layer to form a silicon-on-insulator structure. The monocrystal silicon layer is surrounded by field oxide films. The monocrystal silicon layer further comprises the following parts. A body region of a first conductivity type is selectively formed on the buried silicon oxide layer. A first diffusion region of a second conductivity type acts as one of source and drain regions and being selectively formed on the buried silicon oxide layer and in one side of the body region. A second diffusion region of the second conductivity type acts as another one of the source and drain regions and being selectively formed on the buried silicon oxide layer and in an opposite side of the body region so that the channel region is positioned between the first and second diffusion regions. An isolation layer is selectively formed on the buried silicon oxide layer and is bounded with the first diffusion region so that the first diffusion region is positioned between the body region and the isolation layer. A body contact region of the first conductivity type is selectively formed on the buried silicon oxide layer and is bounded with the isolation layer so that the body contact region is isolated by the isolation layer from the first diffusion region. A pair of carrier path regions of the first conductivity type is selectively formed on the buried silicon oxide layer so that the carrier path regions extend along first opposite sides of the monocrystal silicon layer in a channel length direction, where the first opposite sides are distanced from each other in a channel width direction perpendicular to the channel length direction, and the carrier path regions being bounded with the field oxide films, whereby each of the carrier path regions is in contact directly with the body contact region, the first and second diffusion regions, the isolation layer and the body region. A gate insulation film is selectively provided on the body region. A gate electrode is provided on the gate insulation film and over the channel region. Anti-silicidation layers made of a material which exhibits no silicidation reaction with a metal under a heat treatment do extend over at least both the selected parts of the carrier path regions and boundary portions of the first and second diffusion regions, which are bounded to and in the vicinity of the selected parts of the carrier path regions. A silicide layer with the metal is selectively formed so as to be separated from at least the selected part of each of the carrier path regions, so that the body region and the body contact region are electrically connected to each other through the carrier path regions, and further so that the first and second diffusion regions are electrically isolated from the carrier path regions and from the body region as well as from the body contact region, whereby any excess carriers generated in the body region are allowed to be withdrawn through the carrier path regions to the body contact region.

It is preferable to further provide an inter-layer insulator which covers the gate electrode, the first and second diffusion regions, the isolation layer, the body contact region, and the carrier path regions, and a contact layer formed in a contact hole formed in the inter-layer insulator and over the body contact region so tat the contact layer is in contact with the body contact region, and further an interconnection layer extending over the inter-layer insulator and also being connected with the contact layer so that the interconnection layer is electrically connected through the contact layer to the body contact region; In this case, it is also preferable to further provide lightly doped silicon regions of the second conductivity type having a lower impurity concentration than impurity concentrations of the first and second diffusion regions. The lightly doped silicon regions are provided on the buried silicon oxide layer and between the body region and the first diffusion region and between the body region and the second diffusion region, whereby the carrier path regions are partially in contact with the lightly doped silicon regions but are electrically isolated from the lightly doped silicon regions. In this case, it is also preferable to provide side wall insulation films being provided on opposite side walls of the gate electrode and on top surfaces of the lightly doped silicon regions.

It is also preferable that the silicide layers are formed on both the body contact region and the first and second diffusion regions, and the silicide layers are separated from at least the selected parts of the carrier path regions, so that the body region and the body contact region are electrically connected to each other through the carrier path regions, and so that the first and second diffusion regions are electrically isolated from the carrier path region and from the body region as well as from the body contact region, whereby any excess carriers generated in the body region are allowed to be withdrawn through the carrier path region to the body contact region.

It is also preferable that the silicide layers are formed on both the body contact region and the first and second diffusion regions as well as on the carrier path regions except for the selected parts thereof so that the silicide layers are separated from the selected parts of the carrier path regions, whereby the body region and the body contact region are electrically connected to each other through the carrier path regions, and whereby the first and second diffusion regions are electrically isolated from the carrier path regions and from the body region as well as from the body contact region, resulting in that any excess carriers generated in the body region are allowed to be withdrawn through the carrier path regions to the body contact region.

It is also preferable that the silicide layers are formed to be separated from any parts of each of the carrier path regions, so that the body region and the body contact region are electrically connected to each other through the carrier path region, and so that the first and second diffusion regions are electrically isolated from the carrier path region and from the body region as well as from the body contact region, whereby any excess carriers generated in the body region are allowed to be withdrawn through the carrier path regions to the body contact region.

It is also preferable that the anti-silicidation layers extend over both entire parts of the carrier path regions and boundary portions of the first and second diffusion regions and the body contact regions, which are bounded to and in the vicinity of the carrier path regions, so that the silicide layers are selectively formed so as to be separated from the entire parts of the carrier path regions, and so that the body region and the body contact region are electrically connected to each other through the carrier path regions, and further so that the first and second diffusion regions are electrically isolated from the carrier path regions and from the body region as well as from the body contact region, whereby any excess carriers generated in the body region are allowed to be withdrawn through the carrier path regions to the body contact region. In this case, it is also preferable that the anti-silicidation layers are made of insulator. In this case, it is further preferable that the insulator is silicon dioxide.

The sixth present invention provides an SOI-MOS field effect transistor comprising the following elements. A buried silicon oxide layer is provided on a silicon substrate. A monocrystal silicon layer is provided on the buried silicon oxide layer to form a silicon-on-insulator structure. The monocrystal silicon layer is surrounded by field oxide films. The monocrystal silicon layer further comprises the following parts. A channel region of a first conductivity type is selectively formed on the buried silicon oxide layer. A first diffusion region of a second conductivity type acts as one of source and drain regions and is selectively formed on the buried silicon oxide layer and in one side of the channel region. A second diffusion region of the second conductivity type acts as another one of the source and drain regions and is selectively formed on the buried silicon oxide layer and in an opposite side of the channel region so that the channel region is positioned between the first and second diffusion regions. An isolation layer is selectively formed on the buried silicon oxide layer and is bounded with the first diffusion region so that the first diffusion region is positioned between the channel region and the isolation layer. A body contact region of the first conductivity type is selectively formed on the buried silicon oxide layer and is bounded with the isolation layer so that the body contact region is isolated by the isolation layer from the first diffusion region. A pair of crier path regions of the first conductivity type is selectively formed on the buried silicon oxide layer so that the carrier path regions extend along first opposite sides of the monocrystal silicon layer in a channel length direction, where the first opposite sides are distanced from each other in a channel width direction perpendicular to the channel length direction. The carrier path regions is bounded with the field oxide films, whereby each of the carrier path regions is in contact directly with the body contact region, the first and second diffusion regions, the isolation layer and the body region. A gate insulation film is selectively provided on the channel region. A gate electrode is provided on the gate insulation film and over the channel region. Lightly doped silicon regions of the second conductivity type having a lower impurity concentration than impurity concentrations of the first and second diffusion regions are provided on the buried silicon oxide layer and between the channel region and the first diffusion region and between the channel region and the second diffusion region. Side wall insulation films are provided on opposite side walls of the gate electrode and on top surfaces of the lightly doped silicon regions. An inter-layer insulator covers the gate electrode, the first and second diffusion regions, the isolation layer, the body contact region, and the carrier path regions. A contact layer is formed in a contact hole formed in the inter-layer insulator and over the body contact region so that the contact layer is in contact with the body contact region. An interconnection layer extends over the inter-layer insulator and also is connected with the contact layer so that the interconnection layer is electrically connected through the contact layer to the body contact region, Anti-silicidation layers made of a material which exhibits no silicidation reaction with a metal under a heat treatment do extend over at least both the carrier path regions and boundary portions of the first and second diffusion regions, which are bounded to and in the vicinity of the carrier path regions. Silicide layers with the metal are selectively formed on both the body contact region and the first and second diffusion regions. The silicide layers are separated from the carrier path regions, so that the channel region and the body contact region are electrically connected to each other through the carrier path regions, and further so that the first and second diffusion regions are electrically isolated from the carrier path regions and from the channel region as well as from the body contact region, whereby any excess carriers generated in the channel region are allowed to be withdrawn through the carrier path regions to the body contact region.

It is preferable that the anti-silicidation layers are made of insulator. The insulator may be silicon dioxide.

The seventh present invention provides a gate array semiconductor device having a plurality of SOI-MOS field effect transistors being gate-arrayed. Each of the SOI-MOS field effect transistors comprises the following elements. A buried silicon oxide layer is provided on the silicon substrate. A monocrystal silicon layer is provided on the buried silicon oxide layer to form a silicon-on-insulator structure, the monocrystal silicon layer being surrounded by field oxide films. The monocrystal silicon layer further comprises the following elements. A channel region of a first conductivity type is selectively formed on the buried silicon oxide layer. A first diffusion region of a second conductivity type acting as one of source and drain regions is selectively formed on the buried silicon oxide layer and in one side of the body region. A second diffusion region of the second conductivity type acting as another one of the source and drain regions is selectively formed on the buried silicon oxide layer and in an opposite side of the body region so that the body region is positioned between the first and second diffusion regions. An isolation layer is selectively formed on the buried silicon oxide layer and is bounded with the first diffusion region so that the first diffusion region is positioned between the body region and the isolation layer. A body contact region of the first conductivity type is selectively formed on the buried silicon oxide layer and being bounded with the isolation layer so that the body contact region is isolated by the isolation layer from the first diffusion region. A pair of carrier path regions of the first conductivity type is selectively formed on the buried silicon oxide layer so that the carrier path regions extend along first opposite sides of the monocrystal silicon layer in a channel length direction, where the first opposite sides are distanced from each other in a channel width direction perpendicular to the channel length direction. The carrier path regions is bounded with the field oxide films, whereby each of the carrier path regions is in contact directly with the body contact region, the first and second diffusion regions, the isolation layer and the body region. A gate insulation film is selectively provided on the body region. A gate electrode is provided on the gate insulation film and over the body region. Anti-silicidation layers made of a material which exhibits no silicidation reaction with a metal under a beat treatment do extend over at least both the selected parts of the carrier path regions and boundary portions of the first and second diffusion regions, which are bounded to and in the vicinity of the selected parts of the carrier path regions. A silicide layer with the metal is selectively formed so as to be separated from at least the selected part of each of the carrier path regions, so that the body region and the body contact region are electrically connected to each other through the carrier path regions, and further so that the first and second diffusion regions are electrically isolated from the carrier path regions and from the body region as well as from the body contact region, whereby any excess carriers generated in the body region are allowed to be withdrawn through the carrier path regions to the body contact region.

It is preferable that each of the SOI-MOS field effect transistors further comprises: an inter-layer insulator which covers the gate electrode, the first and second diffusion regions, the isolation layer, the body contact region, and the carrier path regions; a contact layer formed in a contact hole formed in the inter-layer insulator and over the body contact region so that the contact layer is in contact with the body contact region; and an interconnection layer extending over the inter-layer insulator and also being connected with the contact layer so that the interconnection layer is electrically connected through the contact layer to the body contact region.

It is also preferable that each of the SOI-MOS field effect transistors further comprises lightly doped silicon regions of the second conductivity type having a lower impurity concentration than impurity concentrations of the first and second diffusion regions, and the lightly doped silicon regions being provided on the buried silicon oxide layer and between the body region and the first diffusion region and between the body region and the second diffusion region, whereby the carrier path regions are partially in contact with the lightly doped silicon regions but are electrically isolated from the lightly doped silicon regions. In this case, it is preferable that each of the SOI-MOS field effect transistors further comprises side wall insulation films being provided on opposite side walls of the gate electrode and on top surfaces of the lightly doped silicon regions.

It is also preferable that the silicide layers are formed on both the body contact region and the first and second diffusion regions, and the silicide layers are separated from at least the selected parts of the carrier path regions, so that the body region and the body contact region are electrically connected to each other through the carrier path regions, and so that the first and second diffusion regions are electrically isolated from the carrier path region and from the body region as well as from the body contact region, whereby any excess carriers generated in the body region are allowed to be withdrawn through the carrier path region to the body contact region.

It is also preferable that the silicide layers are formed on both the body contact region and the first and second diffusion regions as well as on the carrier path regions except for the selected parts thereof so that the silicide layers are separated from the selected parts of the carrier path regions, whereby the body region and the body contact region are electrically connected to each other through the carrier path regions, and whereby the first and second diffusion regions are electrically isolated from the carrier path regions and from the body region as well as from the body contact region, resulting in that any excess carriers generated in the body region are allowed to be withdrawn through the carrier path regions to the body contact region.

It is also preferable that the silicide layers are formed to be separated from any parts of each of the carrier path regions, so that the body region and the body contact region are electrically connected to each other through the carrier path region, and so that the first and second diffusion regions are electrically isolated from the carrier path region and from the body region as well as from the body contact region, whereby any excess carriers generated in the body region are allowed to be withdrawn through the carrier path regions to the body contact region.

It is also preferable that the anti-silicidation layers extend over both entire parts of the carrier path regions and boundary portions of the first and second diffusion regions and the body contact regions, which are bounded to and in the vicinity of the carrier path regions, so that the silicide layers are selectively formed so as to be separated from the entire parts of the carrier path regions, and so that the body region and the body contact region are electrically connected to each other through the carrier path regions, and further so that the first and second diffusion regions are electrically isolated from the carrier path regions and from the body region as well as from the body contact region, whereby any excess carriers generated in the body region are allowed to be withdrawn through the carrier path regions to the body contact region. In this case, it is also preferable that the anti-silicidation layers are made of insulator. In this case, it is preferable that the insulator is silicon dioxide.

The eighth present invention provides a method of forming a silicon-on-insulator structure over an insulation region in a field effect transistor. The method comprises the following steps. A silicon-on-insulator layer is formed on an insulation region. The silicon-on-insulator layer comprises the following regions. A body region of a first conductivity type is selectively formed on the insulation region. A diffusion region of a second conductivity type is selectively formed on the insulation region and in one side of the body region. An isolation layer is selectively formed on the insulation region and is bounded with the diffusion region so that the diffusion region is positioned between the body region and the isolation layer. A body contact region of the first conductivity type is selectively formed on the insulation region and is bounded with the isolation layer so that the body contact region is isolated by the isolation layer from the diffusion region. At least a carrier path silicon layer of the first conductivity type is selectively formed on the insulation region so that the carrier path silicon layer extends in contact directly with the body contact region, the diffusion region, the isolation layer and the body region. An anti-silicidation layer made of a material which exhibits no silicidation reaction with a metal under a heat treatment is selectively provided so that the anti-silicidation layer extends over at least both the selected part of the carrier path silicon layer and a boundary portion of the diffusion region, which is bounded to and in the vicinity of the selected part of the carrier path silicon layer. A metal layer is entirely deposited over the anti-silicidation layer and the silicon-on-insulator layer including the isolation layer. A heat treatment is carried out to cause a silicidation reaction whereby a silicide layer is selectively formed so as to be separated from at least the selected part of the carrier path silicon layer. An unreacted metal layer is removed from the isolation layer and from the anti-silicidation layer, so that the body region and the body contact region are electrically connected to each other through the carrier path silicon layer, and further so that the diffusion region is electrically isolated from the carrier path silicon layer and from the body region as well as from the body contact region, whereby any excess carriers generated in the body region are allowed to be withdrawn through the carrier path silicon layer to the body contact region.

It is preferable that the silicide layers are formed on both the body contact region and the first and second diffusion regions, and the silicide layers are separated from at least the selected parts of the carrier path regions, so that the body region and the body contact region are electrically connected to each other through the carrier path regions, and so that the first and second diffusion regions are electrically isolated from the carrier path region and from the body region as well as from the body contact region, whereby any excess carriers generated in the body region are allowed to be withdrawn through the carrier path region to the body contact region.

It is also preferable that the silicide layers are formed on both the body contact region and the first and second diffusion regions as well as on the carrier path regions except for the selected parts thereof so that the silicide layers are separated from the selected parts of the carrier path regions, whereby the body region and the body contact region are electrically connected to each other through the carrier path regions, and whereby the first and second diffusion regions are electrically isolated from the carrier path regions and from the body region as well as from the body contact region, resulting in that any excess carriers generated in the body region are allowed to be withdrawn through the carrier path regions to the body contact region.

It is also preferable that the silicide layers are formed to be separated from any parts of each of the carrier path regions, so that the body region and the body contact region are electrically connected to each other through the carrier path region, and so that the first and second diffusion regions are electrically isolated from the carrier path region and from the body region as well as from the body contact region, whereby any excess carriers generated in the body region are allowed to be withdrawn through the carrier path regions to the body contact region.

It is also preferable that the anti-silicidation layers extend over both entire parts of the carrier path regions and boundary portions of the first and second diffusion regions and the body contact regions, which are bounded to and in the vicinity of the carrier path regions, so that the silicide layers are selectively formed so as to be separated from the entire parts of the carrier path regions, and so that the body region and the body contact region are electrically connected to each other through the carrier path regions, and further so that the first and second diffusion regions are electrically isolated from the carrier path regions and from the body region as well as from the body contact region, whereby any excess carriers generated in the body region are allowed to be withdrawn through the carrier path regions to the body contact region.

PREFERRED EMBODIMENTS

First Embodiment

Figure 5:
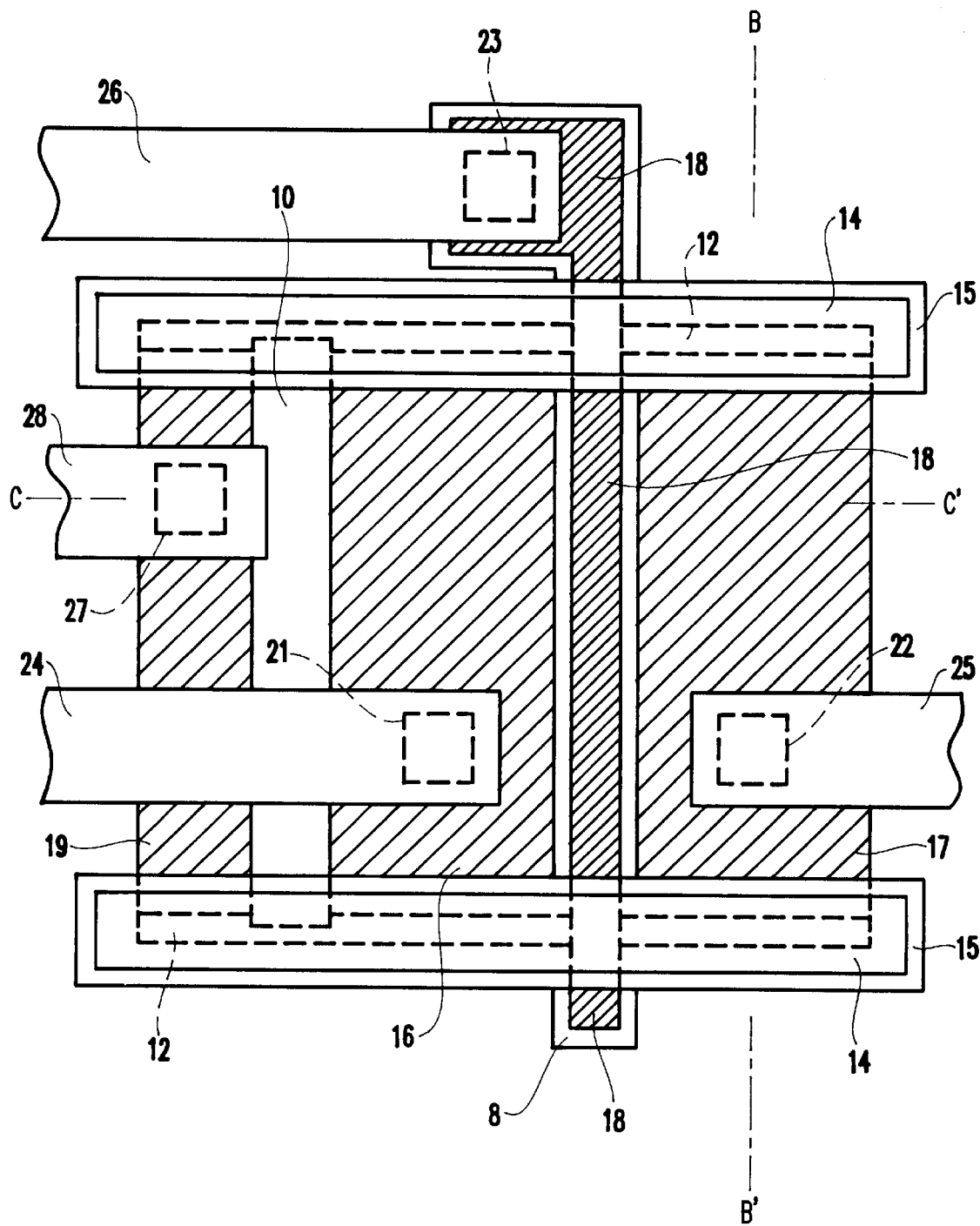
FIG. 5 is a fragmentary plane view illustrative of a novel SOI-MOS field effect transistor in a first embodiment in accordance with the present invention.
Figure 6A:
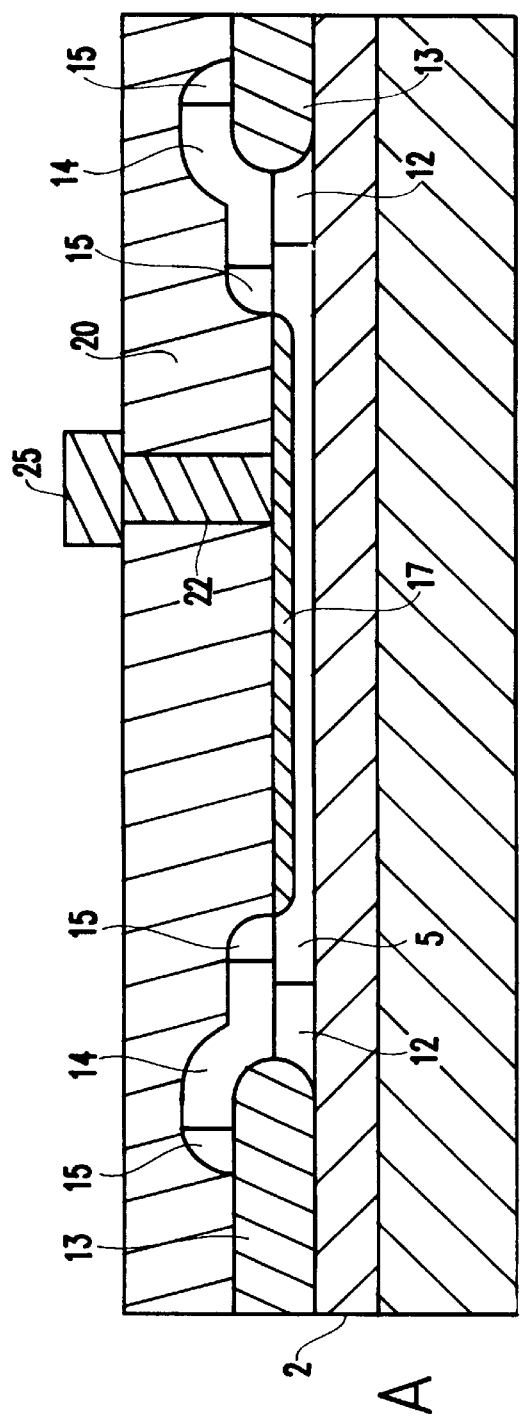
FIG. 6A is a fragmentary cross sectional elevation view illustrative of a novel SOI-MOS field effect transistor taken along a B-B' line of FIG. 5 in a first embodiment in accordance with the present invention.
Figure 6B:
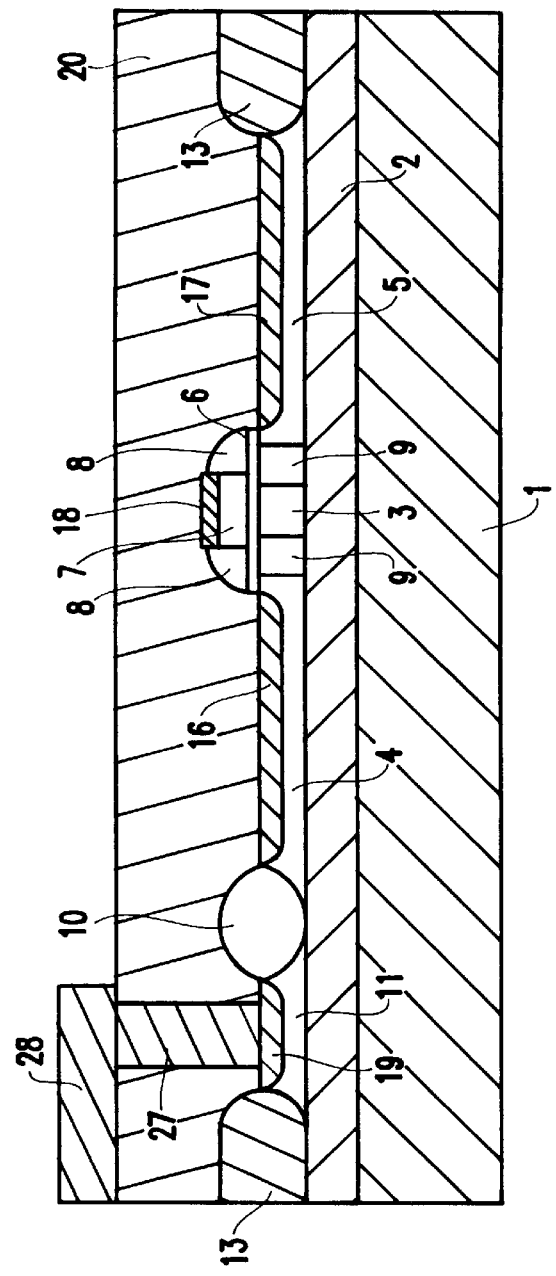
FIG. 6B is a fragmentary cross sectional elevation view illustrative of a novel SOI-MOS field effect transistor taken along a C-C' line of FIG. 5 in a first embodiment in accordance with the present invention.

A first embodiment according to the present invention will be described in detail with reference to FIGS. 5, 6A and 6B, wherein a novel SOI-MOS field effect transistor is provided which comprises the following elements. A buried silicon oxide layer 2 is provided on a silicon substrate 1. A monocrystal silicon layer is provided on the buried silicon oxide layer 2 to form a silicon-on-insulator structure. The monocrystal silicon layer is surrounded by field oxide films 13. The monocrystal silicon layer farther comprises the following parts. A body region 3 of a first conductivity type is selectively formed on the buried silicon oxide layer 2. A first diffusion region 4 of a second conductivity type acts as one of source and drain regions and is selectively formed on the buried silicon oxide layer 2 and in one side of the body region 3. A second diffusion region 5 of the second conductivity type acts as another one of the source and drain regions and is selectively formed on the buried silicon oxide layer 2 and in an opposite side of the body region 3 so that the body region 3 is positioned between the first and second diffusion regions 4 and 5. An isolation layer 10 is selectively formed on the buried silicon oxide layer 2 and is bounded with the first diffusion region 4 so that the first diffusion region 3 is positioned between the channel region 1 and the isolation layer 10. A body contact region 11 of the first conductivity type is selectively formed on the buried silicon oxide layer 2 and is bounded with the isolation layer 10 so that the body contact region 11 is isolated by the isolation layer 10 from the first diffusion region 4. A pair of carrier path regions 12 of the first conductivity type is selectively formed on the buried silicon oxide layer 2 so that the carrier path regions 12 extend along first opposite sides of the monocrystal silicon layer in a channel length direction, where the first opposite sides are distanced from each other in a channel width direction along B-B' line of FIG. 5 perpendicular to the channel length direction along C-C' line. The carrier path regions 12 are bounded with the field oxide films 13, whereby each of the carrier path regions 12 is in contact directly with the body contact region 11, the first and second diffusion regions 4 and 5, the isolation layer 10 and the body region 3. A gate insulation film 6 is selectively provided on the body region 3. A gate electrode 7 is provided on the gate insulation film 6 and over the body region 3. Lightly doped silicon regions 9 of the second conductivity type having a lower impurity concentration than impurity concentrations of the first and second diffusion regions 4 and 5 are provided on the buried silicon oxide layer 2 and between the body region 3 and the first diffusion region 4 and between the body region 3 and the second diffusion region 5. Side wall insulation films 8 are provided on opposite side walls of the gate electrode 7 and on top surfaces of the lightly doped silicon regions 9. An inter-layer insulator 20 covers the gate electrode 7, the first and second diffusion regions 4 and 5, the isolation layer 10, the body contact region 11, and the carrier path regions 12. A contact layer 27 is formed in a contact hole formed in the inter-layer insulator 20 and over the body contact region 11 so that the contact layer 27 is in contact with the body contact region 11. An interconnection layer 28 extends over the inter-layer insulator 20 and also is connected with the contact layer 27 so that the interconnection layer 28 is electrically connected through the contact layer 27 to the body contact region 11. Anti-silicidation layers 14 and 15 made of an insulator which exhibits no silicidation reaction with a metal under a heat treatment do extend over the paired carrier path regions 12 and boundary portions of the first and second diffusion regions 4 and 5, which are bounded to and in the vicinity of the carrier path regions 12. The anti-silicidation layers 14 and 15 also extend over the boundary portions of the field oxide films 13. Silicide layers 16, 17, 18 and 19 are selectively formed on the first and second diffusion regions 4 and 5, the gate electrode 7 and the body contact region 11, respectively. The silicide layers 16, 17, 18 and 19 are separated from the carrier path regions 12, so that the body region 3 and the body contact region 11 are electrically connected to each other through the carrier path regions 12, and further so that the first and second diffusion regions 4 and 5 are electrically isolated from the carrier path regions 12 and from the body region 3 as well as from the body contact region 11, whereby any excess carriers generated in the body region 3 due to an impact ionization phenomenon are allowed to be withdrawn through the carrier path regions 12, the body contact region 11 and the contact layer 27 to the interconnection layer 28. The above carrier path structure makes the SOI-MOS field effect transistor free from the various problems caused by the floating-body effects.

The above body contact region 11 of the first conductivity type has a higher impurity concentration than an impurity concentration of the body region 3. The carrier path layers 12 of the first conductivity type have an impurity concentration which is equal to or higher than an impurity concentration of the body region 3 but is lower than an impurity concentration of the body contact region 11.

The above anti-silicidation layers 14 and 15 comprise an insulation layer 14 and side wall insulation films 15 on opposite side wails of the insulation layer 14.

The silicide layer may comprise a refractory metal silicide layer, for example, $TiSi_2$, $CoSi_2$, and $NiSi$, or a noble metal.

The isolation layer 10 isolates the body contact region 11 of the first conductivity type from the first diffusion layer 4 of the second conductivity type so as to makes the SOI-MOS field effect transistor free from the problem with a drop of junction break down voltage.

The carrier path regions 12 of the first conductivity type has an impurity concentration which is lower than an impurity concentration of the body contact region 11 so that the SOI-MOS field effect transistor is free from the problem with a drop of junction break down voltage between the carrier path regions 12 and the first and second diffusion regions serving as source/drain regions.

The silicide layers 16, 17, 18 and 19 serve to reduce the parasitic resistances of the first and second diffusion regions 4 and 5, the gate electrode 7 and the body contact region 11.

The carrier path regions 12 of the first conductivity type are electrically isolated from the first and second diffusion regions 4 and 5 of the second conductivity type serving as the source/drain regions by p-n junction. No short circuit of silicide layer is formed between the carrier path regions 12 and the first and second diffusion regions 4 and 5.

The following descriptions will be highlighted on novel fabrication processes for the above described SOI-MOS field effect transistor.

Figure 7A:
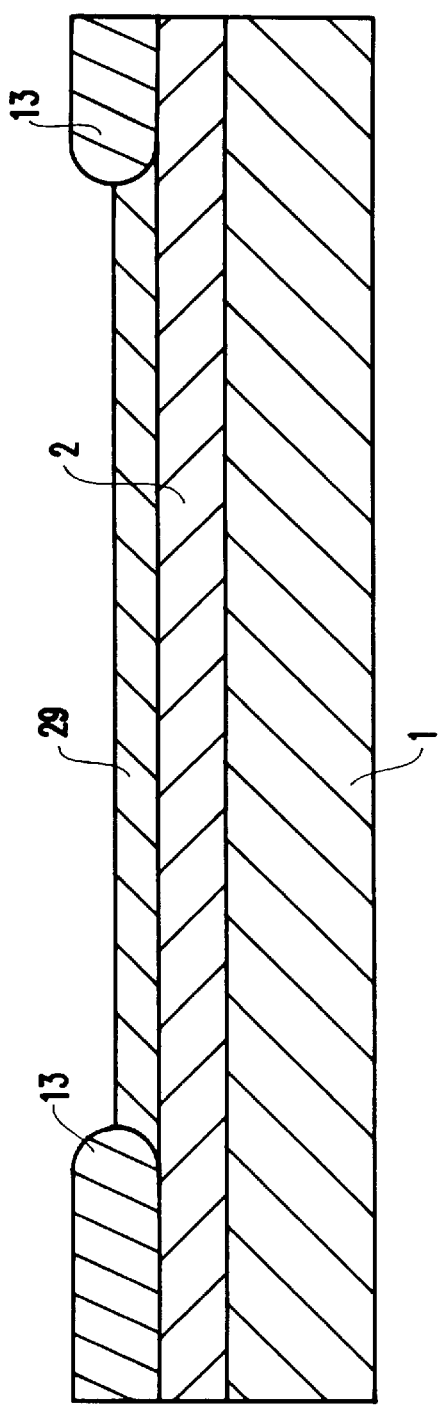

With reference to FIG. 7A, a buried oxide film 2 is formed on a top surface of a silicon substrate 1. A single crystal silicon layer 29 is formed on a top surface of the buried oxide film 2. Field oxide films 13 are selectively formed on the buried oxide film 2 to surround the single crystal silicon layer 29.

Figure 7B:
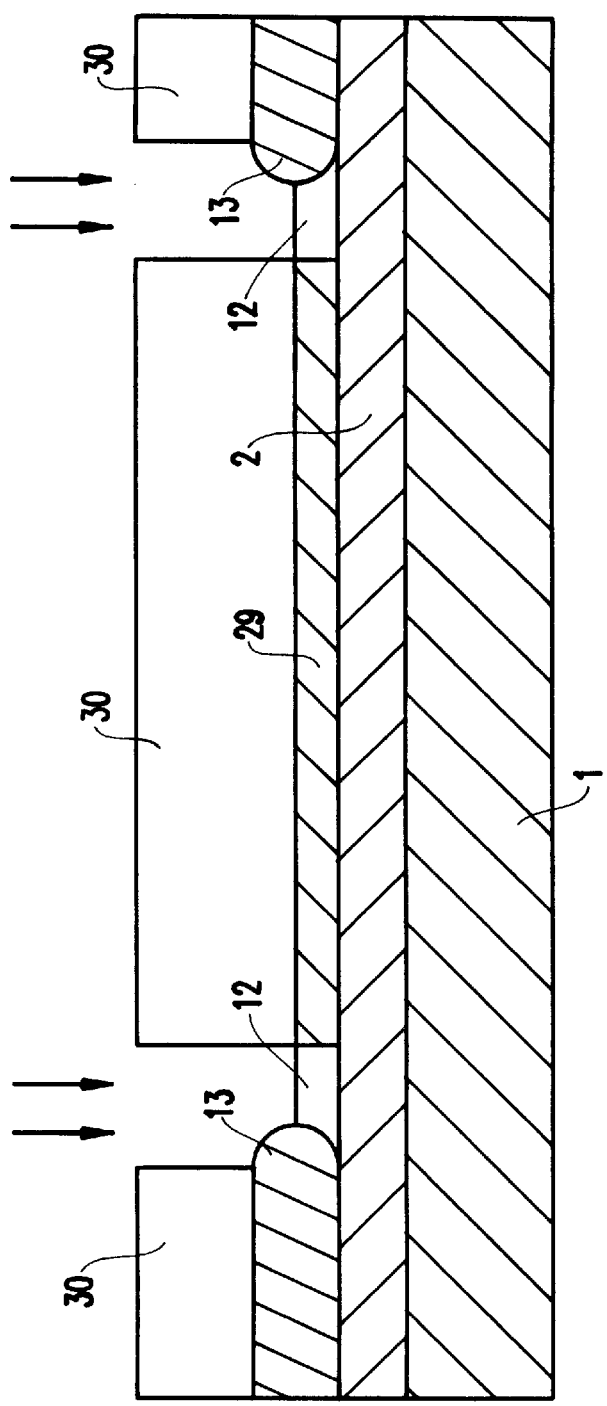

With reference to FIG. 7B, a photo-resist is entirely applied over the single crystal silicon layer 29 and over the field oxide films 13. The photo-resist is patterned by a photo-lithography technique to form a photo-resist film 30. An ion-implantation of an impurity of the first conductivity type is carried out by use of the photo-resist film 30 as a mask to selectively introduce the impurity into the opposite side regions of the single crystal silicon layer 29 to form carrier path regions 12, wherein the carrier path regions 12 are bounded with the field oxide films 13 and extend in a channel length direction and also are distanced from each other in a channel width direction which is perpendicular to the channel length direction. The used photo-resist film 30 is removed. A thin oxide film is formed on the single crystal silicon layer 29. A polysilicon layer is formed on the thin oxide film. The polysilicon layer is patterned to define a gate electrode 7 on the, wherein the and the gate electrode 7 are not illustrated in FIG. 7B. An ion-implantation is carried out by use of the field oxide films 13 and the gate electrode 7 as masks for introduction of an impurity of the second conductivity type into the single crystal silicon layer 29 by a self-aliment technique so that the single crystal silicon layer 29 is lightly doped. A silicon oxide film is entirely formed to cover the field oxide films 13, the carrier path regions 12, and the single crystal silicon layer 29 as well as extends on a top surface and opposite side walls of the gate electrode 7. A reactive ion etching is carried out to the silicon oxide film to leave the silicon oxide film only on the opposite side walls of the gate electrode 7 whereby side wall oxide films 8 are formed which are, however, not illustrated in FIG. 7B.

Figure 7C:
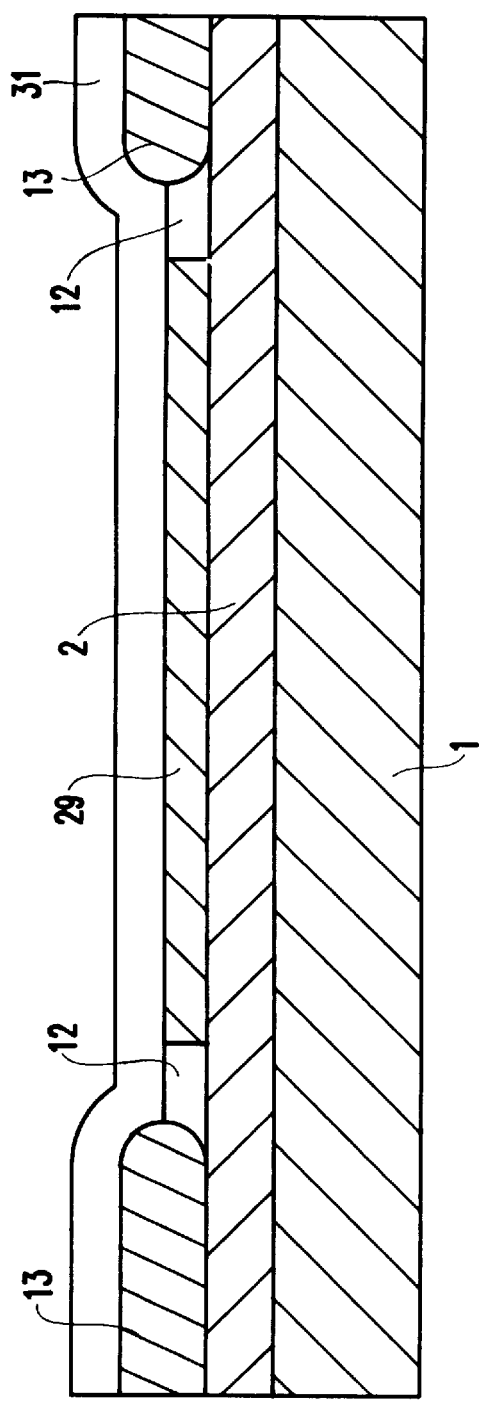

With reference to FIG. 7C, an insulation layer 31 is entirely deposited on the field oxide films 13, the carrier path regions 12 and the single crystal silicon layer 29. The insulation layer 31 may comprise a silicon oxide film which has been deposited by a plasma chemical vapor deposition method.

Figure 7D:
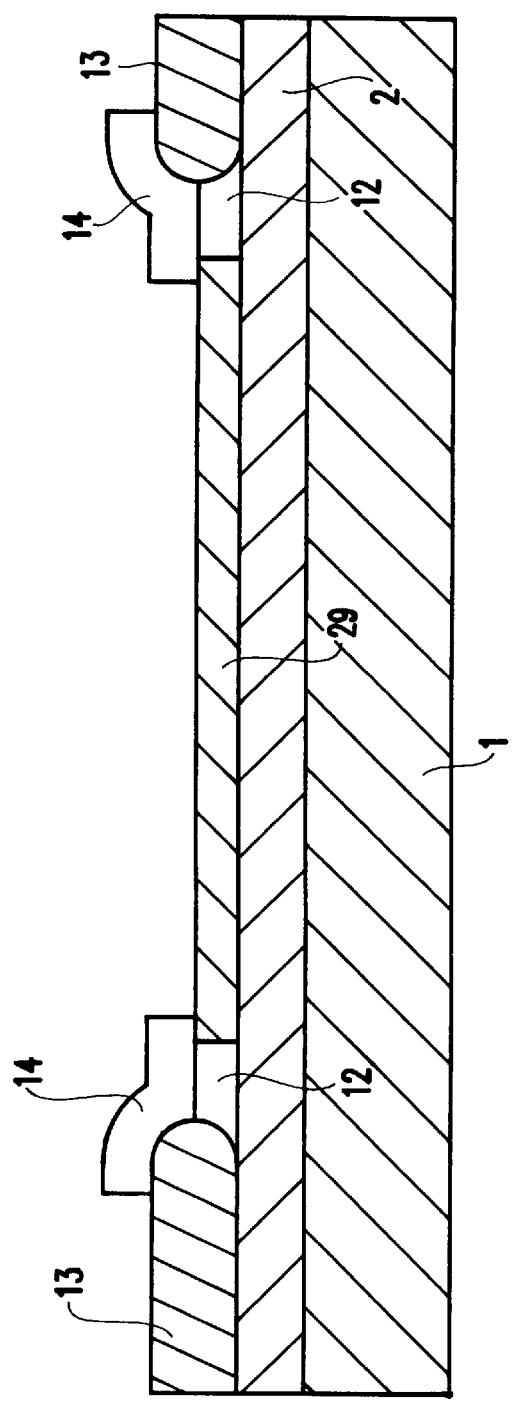

With reference to FIG. 7D, a photo-resist is applied on the insulation layer 31. The photo-resist is patterned by a photo-lithography technique to define a photo-resist film serving as a mask which is, however, not illustrated in FIG. 7D. The insulation layer 31 is selectively etched by use of the photo-resist film as a mask to leave the insulation layer 31 only over the carrier path regions 12 and parts of the field oxide films in the vicinity of the carrier path regions 12 as well as over parts of the single crystal silicon layer 29 lightly doped but in the vicinity of the carrier path regions 12, whereby insulation layers 14 are selectively formed over the carrier path regions 12 and parts of the field oxide films in the vicinity of the carrier path regions 12 as well as over parts of the single crystal silicon layer 29 lightly doped but in the vicinity of the carrier path regions 12.

With reference to FIG. 7E, photo-resist films 32 are selectively formed by a photo-lithography technique so that the photo-resist films 32 cover the field oxide films 13 and a body contact formation region in the lightly doped single crystal silicon layer 29. An ion-implantation of an impurity of the second conductivity type is carried out by use of the photo-resist films 32, the field oxide films 13, the gate electrode 7 and the side wall oxide films 8 as well as the insulation layers 14 as masks to introduce the second conductivity type impurity into the lightly doped single crystal silicon layer 29. The used photo-resist films 32 are removed.

With reference to FIG. 7F, a heat treatment is carried out to activate the second conductivity type impurity in the single crystal silicon layer 29 thereby to form first and second diffuison regions 4 and 5 serving as the source and drain regions. At this process, p-n junctions are formed in the boundaries between the first and second diffuison regions 4 and 5 and the carrier path regions 12. A photo-resist film is selectively formed by a photo-lithography technique for subsequent ion-implantation of an impurity of the first conductivity type into a body contact formation region in the single crystal silicon layer 29 thereby to form a body contact region 11 of the first conductivity type.

Figure 7G:
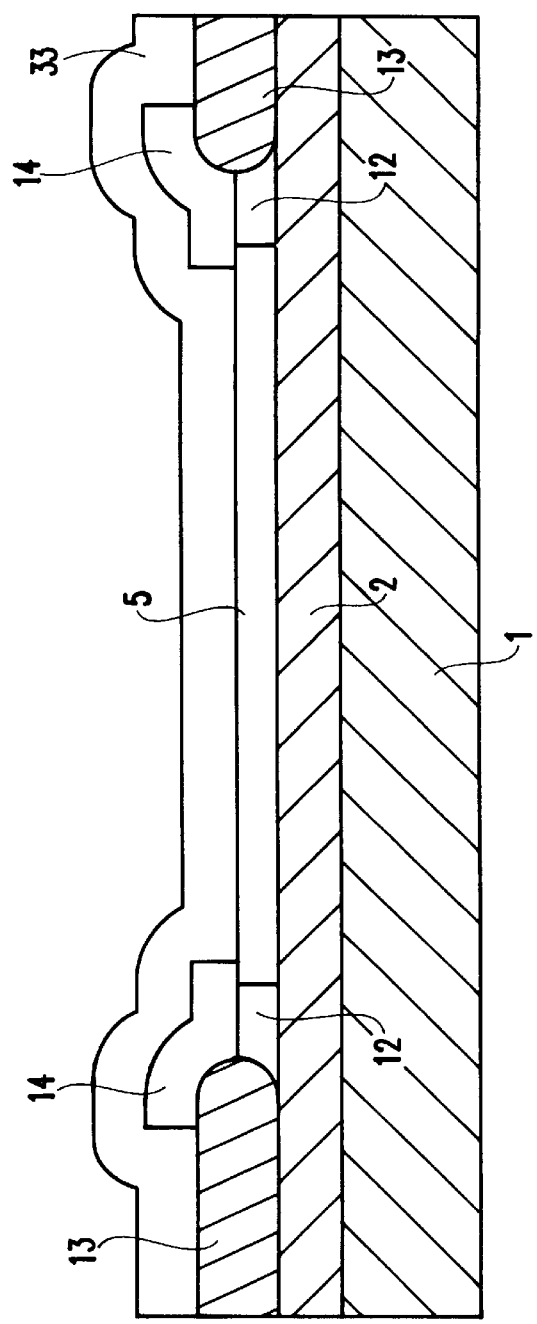

With reference to FIG. 7G, an insulation layer 33 is entirely deposited which covers the field oxide films 13, the insulation layers 14, the first and second diffusion layers 4 and 5, the body contact region 11, the gate electrode 7 and the side wall oxide films 8. The insulation layer 33 may comprise a silicon oxide film deposited by a low pressure chemical vapor deposition method.

Figure 7H:
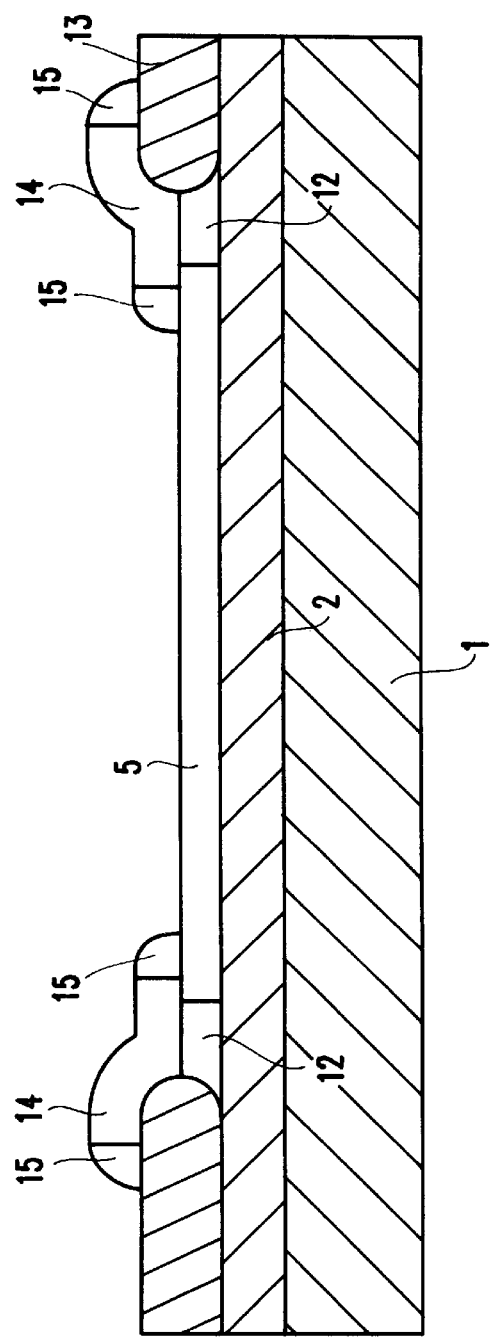

With reference to FIG. 7H, the insulation layer 33 is subjected to an etch back to leave the insulation layer 15 only on side walls of the insulation layers 14, wherein the etch back is carried out by a reactive ion etching by use of $SF_6$ gas and $CCl_2F_2$ gas.

Figure 7I:
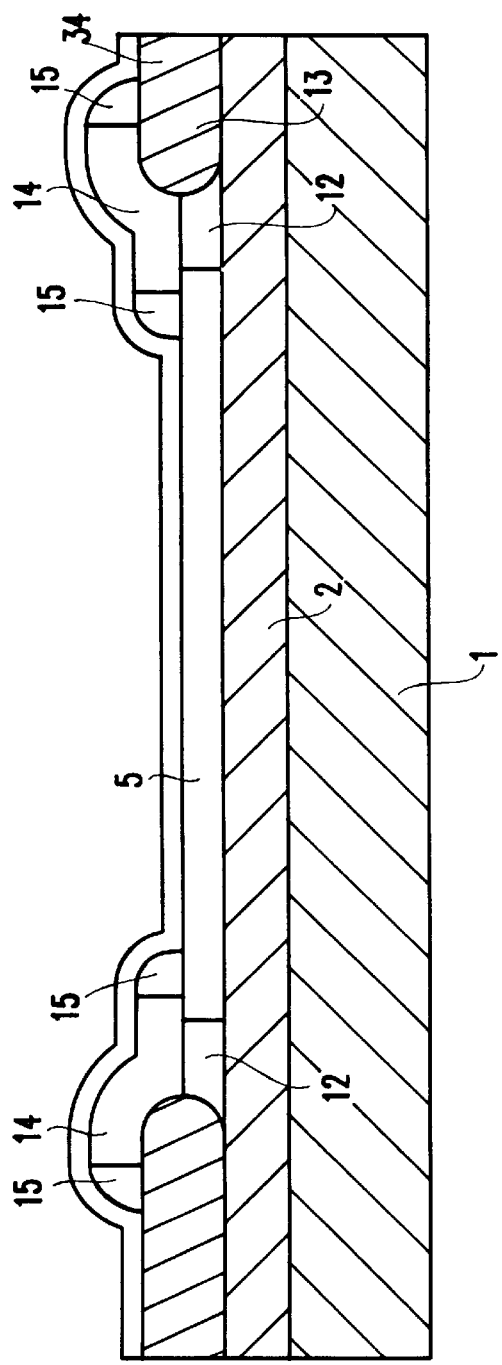

With reference to FIG. 7I, a metal layer 34 is entirely deposited by a sputtering method so that the metal layer 34 extends over the insulation layers 14 and 15, the field oxide films 13, the first and second diffusion regions 4 and 5, the gate electrode 7 and the side wall oxide films 8. The metal layer may comprise a titanium layer, a cobalt layer or a nickel layer.

Figure 7J:
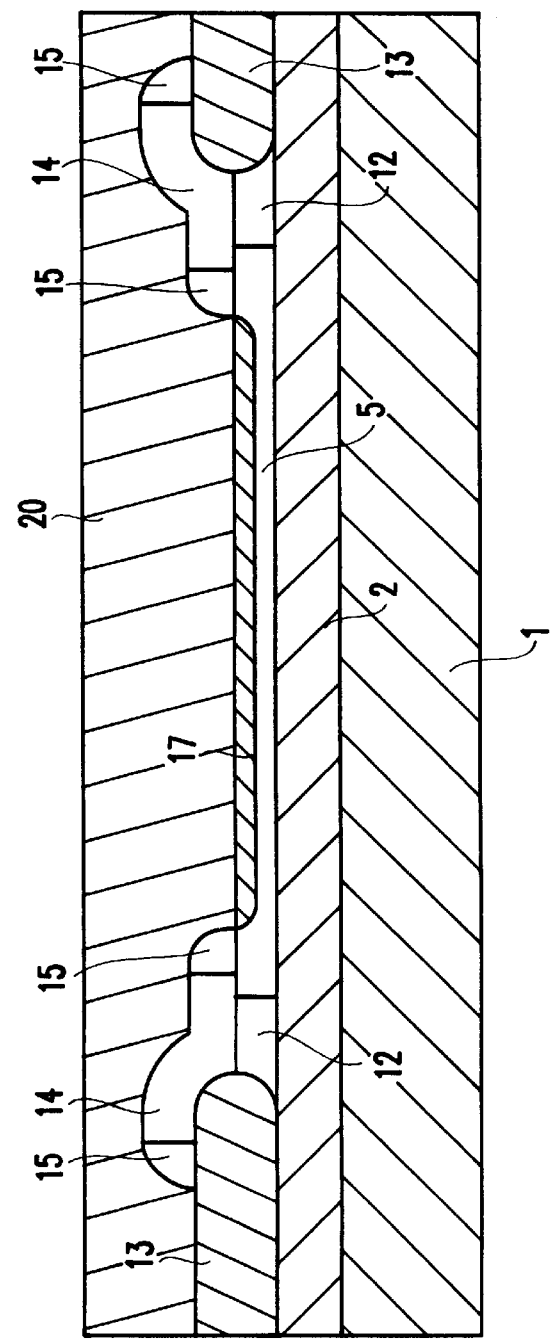

With reference to FIG. 7J, a heat treatment is carried out to cause a silicidation reaction thereby to form silicide layers 16, 17, 18 and 19 on upper regions of the first and second diffusion layers 4 and 5 and on the body contact region 11 as well as on the gate electrode 7. The silicide layer may comprise a titanium silicide layer, a cobalt silicide layer or a nickel silicide layer. The above heat treatment may be the two-step anneal wherein a first step anneal is carried out to cause the silicidation reaction for subsequent selective removal of unreacted metal layer parts before a second step anneal is thereafter carried out. Those anneals may be rapid thermal anneals. An inter-layer insulator 20 is entirely deposited over the field oxide films 13, the insulation layers 14 and 15, the silicide layers 16, 17, 18 and 19, the side wall oxide films 8.

Figure 7K:
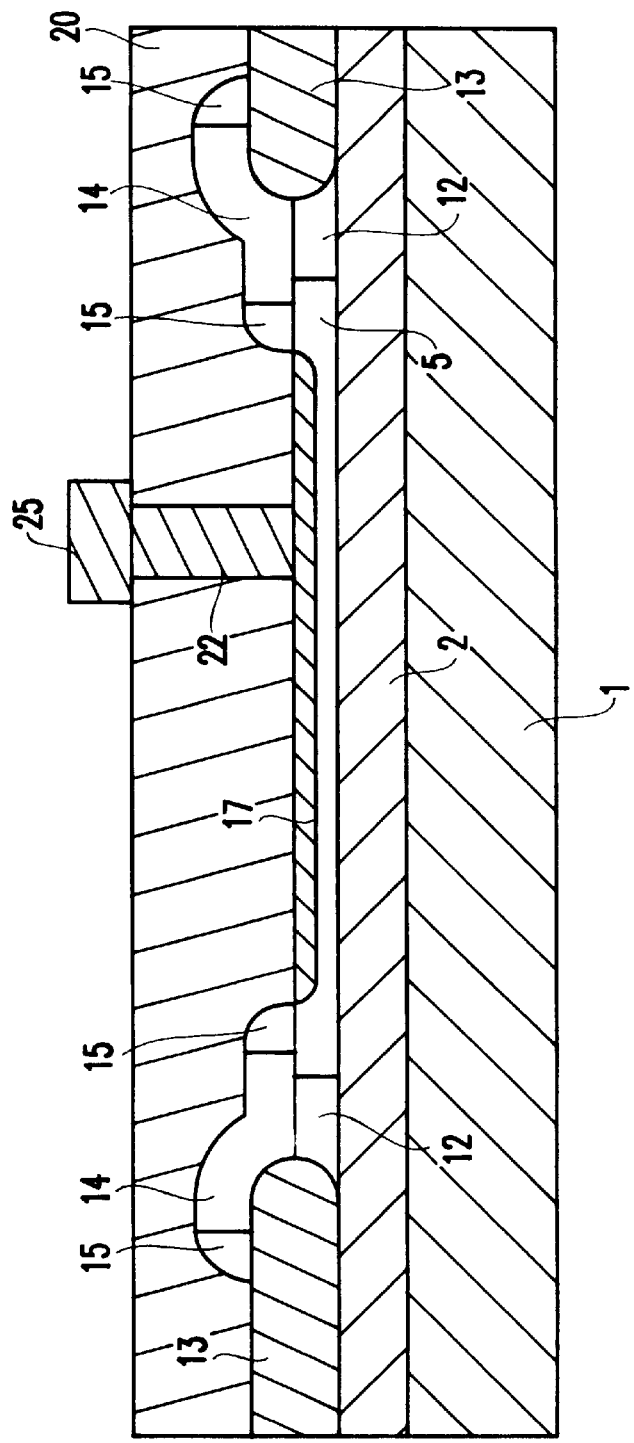

With reference to FIG. 7K, contact holes are formed in the inter-layer insulator 20 to form contact layers 21, 22 and 27 within the contact holes as well as to form a metal layer entirely extending over the inter-layer insulator 20. The metal layer over the inter-layer insulator 20 is patterned to form interconnection layers 24, 25 and 28, whereby the SOI-MOS field effect transistor is completed.

The silicide layers 16, 17, 18 and 19 are separated from the carrier path regions 12, so that the body region 3 and the body contact region 11 are electrically connected to each other through the carrier path regions 12, and further so that the first and second diffusion regions 4 and 5 are electrically isolated from the carrier path regions 12 and from the body region 3 as well as from the body contact region 11, whereby any excess carriers generated in the body region 3 due to an impact ionization phenomenon are allowed to be withdrawn through the carrier path regions 12, the body contact region 11 and the contact layer 27 to the interconnection layer 28. The above carrier path structure makes the SOI-MOS field effect transistor free from the various problems caused by the floating-body effects.

The carrier path regions 12 of the first conductivity type are electrically isolated from the first and second diffusion regions 4 and 5 of the second conductivity type serving as the source/drain regions by p-n junction. No short circuit of silicide layer is formed between the carrier path regions 12 and the first and second diffusion regions 4 and 5.

Second Embodiment

A second embodiment according to the present invention will be described in detail with reference to FIG. 8, wherein a gate array semiconductor device with a silicon-on-insulator structure is provided. The SOI-MOS field effect transistors described in the first embodiment are gate-arrayed so that a set of four SOI-MOS field effect transistors have in common a single body contact region 11 over which a silicide layer 19 is formed.

All of the SOI-MOS field effect transistors aligned in a channel length direction also have in common the insulation layers 14 and 15 and the interconnection layer 28 electrically connected to the body contact region.

Whereas, in FIG. 8, the SOI-MOS field effect transistors of the first embodiment are aligned in the channel length direct ion, the SOI-MOS field effect transistors are also aligned in the channel width direction to form the gate array structure.

If the SOI-MOS field effect transistors of the first embodiment are gate-arrayed, then any excess carriers generated in the body region 3 due to an impact ionization phenomenon are allowed to be withdrawn through the carrier path regions 12, the body contact region 11 and the contact layer 27 to the interconnection layer 28. The above carrier path structure makes the SOI-MOS field effect transistor free from the various problems caused by the floating-body effects.

The isolation layer 10 isolates the body contact region 11 of the first conductivity type from the first diffusion layer 4 of the second conductivity type so as to makes the SOI-MOS field effect transistor free from the problem with a drop of junction break down voltage.

The carrier path regions 12 of the first conductivity type has an impurity concentration which is lower than an impurity concentration of the body contact region 11 so that the SOI-MOS field effect transistor is free from the problem with a drop of junction break down voltage between the carrier path regions 12 and the first and second diffusion regions serving as source/drain regions.

The silicide layers 16, 17, 18 and 19 are separated from the carrier path regions 12, so that the body region 3 and the body contact region 11 are electrically connected to each other through the carrier path regions 12, and further so that the first and second diffusion regions 4 and 5 are electrically isolated from the carrier path regions 12 and from the body region 3 as well as from the body contact region 11, whereby any excess carriers generated in the body region 3 due to an impact ionization phenomenon are allowed to be withdrawn through the carrier path regions 12, the body contact region 11 and the contact layer 27 to the interconnection layer 28. The above carrier path structure makes the SOI-MOS field effect transistor free from the various problems caused by the floating-body effects.

The carrier path regions 12 of the first conductivity type are electrically isolated from the first and second diffusion regions 4 and 5 of the second conductivity type serving as the source/drain regions by p-n junction. No short circuit of silicide layer is formed between the carrier path regions 12 and the first and second diffusion regions 4 and 5.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A silicon-on-insulator structure in a field effect transistor, said structure comprising:
   an insulation region;
   a body region of a first conductivity type being selectively formed on said insulation region;
   a diffusion region of a second conductivity type being selectively formed on said insulation region and in one side of said body region;
   an isolation layer being selectively formed on said insulation region and being bounded with said diffusion region so that said diffusion region is positioned between said body region and said isolation layer;
   a body contact region of said first conductivity type being selectively formed on said insulation region and being bounded with said isolation layer so that said body contact region is isolated by said isolation layer from said diffusion region; and
   at least a carrier path silicon layer of said first conductivity type being selectively formed on said insulation region so that said carrier path silicon layer extends in contact directly with said body contact region, said diffusion region, said isolation layer and said body region,
   wherein an anti-silicidation layer made of a material which exhibits no silicidation reaction with a metal under a heat treatment extends over at least both said selected part of said carrier path silicon layer and a boundary portion of said diffusion region, which is bounded to and in the vicinity of said selected part of said carrier path silicon layer, and
   wherein a silicide layer with said metal is selectively formed so as to be separated from at least said selected part of said carrier path silicon layer, so that said channel region and said body contact region are electrically connected to each other through said carrier path silicon layer, and further so that said diffusion region is electrically isolated from said carrier path silicon layer and from said body region as well as from said body contact region, whereby any excess carriers generated in said body region are allowed to be withdrawn through said carrier path silicon layer to said body contact region.

2. The silicon-on-insulator structure as claimed in claim 1, further comprising:
   a gate insulation film being selectively provided on said body region; and
   a gate electrode provided on said gate insulation film and over said channel region.

3. The silicon-on-insulator structure as claimed in claim 2, further comprising a lightly doped silicon region of said second conductivity type having a lower impurity concentration than an impurity concentration of said diffusion region, and said lightly doped silicon region being provided on said insulation region and between said body region and said diffusion region, whereby said carrier path silicon layer is partially in contact with said lightly doped silicon region but is electrically isolated from said lightly doped silicon region.

4. The silicon-on-insulator structure as claimed in claim 3, further comprising a side wall insulation film being provided on a side wall of said gate electrode and on a top surface of said lightly doped silicon region.

5. The silicon-on-insulator structure as claimed in claim 1, wherein said silicide layer is formed on both said body contact region and said diffusion region, and said silicide layer is separated from at least said selected part of said carrier path silicon layer, so that said body region and said body contact region are electrically connected to each other through said carrier path silicon layer, and so that said diffusion region is electrically isolated from said carrier path silicon layer and from said body region as well as from said, body contact region, whereby any excess carriers generated in said body region are allowed to be withdrawn through said carrier path silicon layer to said body contact region.

6. The silicon-on-insulator structure as claimed in claim 1, wherein said silicide layer is formed on both said body contact region and said diffusion region as well as on said carrier path silicon layer except for said selected part thereof so that said silicide layer is separated from said selected part of said carrier path silicon layer, whereby said body region and said body contact region are electrically connected to each other through said carrier path silicon layer, and whereby said diffusion region is electrically isolated from said carrier path silicon layer and from said body region as well as from said body contact region, resulting in that any excess carriers generated in said channel region are allowed to be withdrawn through said carrier path silicon layer to said body contact region.

7. The silicon-on-insulator structure as claimed in claim 1, wherein said silicide layer is formed to be separated from any parts of said carrier path silicon layer, so that said body region and said body contact region are electrically connected to each other through said carrier path silicon layer, and so that said diffusion region is electrically isolated from said carrier path silicon layer and from said body region as well as from said body contact region, whereby any excess carriers generated in said channel region are allowed to be withdrawn through said carrier path silicon layer to said body contact region.

8. The silicon-on-insulator structure as claimed in claim 1, wherein said anti-silicidation layer extends over both an entire part of said carrier path silicon layer and boundary portions of said diffusion region and body contact regions, which are bounded to and in the vicinity of said carrier path silicon layer, so that said silicide layer is selectively formed so as to be separated from said entire pat of said carrier path silicon layer, and so that said channel region and said body contact region are electrically connected to each other through said carrier path silicon layer, and further so that said diffusion region is electrically isolated from said carrier path silicon layer and from said channel region as well as from said body contact region, whereby any excess carriers generated in said body region are allowed to be withdrawn through said carrier path silicon layer to said body contact region.

9. The silicon-on-insulator structure as claimed in claim 8, wherein said anti-silicidation layer is made of insulator.

10. The silicon-on-insulator structure as claimed in claim 9, wherein said insulator is silicon dioxide.

11. A silicon-on-insulator structure in a field effect transistor, said structure comprising:
   an insulation region;
   a body region of a first conductivity type being selectively formed on said insulation region;
   a diffusion region of a second conductivity type being selectively formed on said insulation region and in one side of said body region;
   an isolation layer being selectively formed on said insulation region and being bounded with said diffusion region so that said diffusion region is positioned between said body region and said isolation layer;
   a body contact region of said first conductivity type being selectively formed on said insulation region and being bounded with said isolation layer so that said body contact region is isolated by said isolation layer from said diffusion region;
   at least a carrier path silicon layer of said first conductivity type being selectively formed on said insulation region so that said carrier path silicon layer extends in contact directly with said body contact region, said diffusion region, said isolation layer and said body region,
   wherein at least a silicide layer is selectively formed on at least said diffusion region and is separated from at least a selected part of said carrier path silicon layers wherein said selected part of said carrier path silicon layer is in contact directly with said diffusion region so that said body region and said body contact region are electrically connected to each other through said carrier path silicon layer, and so that said diffusion region is electrically isolated from said carrier path silicon layer and from said body region as well as from said body contact region, whereby any excess carriers generated in said body region are allowed to be withdrawn through said carrier path silicon layer to said body contact region,
   wherein said silicide layer is formed on both said body contact region and said diffusion region, and said silicide layer is separated from at least said selected part of said carrier path silicon layer, so that said body region and said body contact region are electrically connected to each other through said carrier path silicon layer, and so that said diffusion region is electrically isolated from said carrier path silicon layer and from said body region as well as from said body contact region, whereby any excess carriers generated in said body region are allowed to be withdrawn through said carrier path silicon layer to said body contact region.

12. The silicon-on-insulator structure as claimed in claim 11, further comprising:
   a gate insulation film being selectively provided on said body region; and
   a gate electrode provided on said gate insulation film and over said body region.

13. The silicon-on-insulator structure as claimed in claim 12, further comprising a lightly doped silicon region of said second conductivity type having a lower impurity concentration than an impurity concentration of said diffusion region, and said lightly doped silicon region being provided on said insulation region and between said channel region and said diffusion region, whereby said carrier path silicon layer is partially in contact with said lightly doped silicon region but is electrically isolated from said lightly doped silicon region.

14. The silicon-on-insulator structure as claimed in claim 13, further comprising a side wall insulation film being provided on a side wall of said gate electrode and on a top surface of said lightly doped silicon region.

15. A silicon-on-insulator structure in a field effect transistor, said structure comprising:
   an insulation region;
   a body region of a first conductivity type being selectively formed on said insulation region;
   a diffusion region of a second conductivity type being selectively formed on said insulation region and in one side of said body region;
   an isolation layer being selectively formed on said insulation region and being bounded with said diffusion region so that said diffusion region is positioned between said body region and said isolation layer;

a body contact region of said first conductivity type being selectively formed on said insulation region and being bounded with said isolation layer so that said body contact region is isolated by said isolation layer from said diffusion region;

at least a carrier path silicon layer of said first conductivity type being selectively formed on said insulation region so that said carrier path silicon layer extends in contact directly with said body contact region, said diffusion region, said isolation layer and said body region, wherein at least a silicide layer is selectively formed on at least said diffusion region and is separated from at least a selected part of said carrier path silicon layer, wherein said selected part of said carrier path silicon layer is in contact directly with said diffusion region so that said body region and said body contact region are electrically connected to each other through said carrier path silicon layer, and so that said diffusion region is electrically isolated from said carrier path silicon layer and from said body region as well as from said body contact region, whereby any excess carriers generated in said body region are allowed to be withdrawn through said carrier path silicon layer to said body contact region, wherein said silicide layer is formed on both said body contact region and said diffusion region as well as on said carrier path silicon layer except for said selected part thereof so that said silicide layer is separated from said selected part of said carrier path silicon layer, whereby said body region and said body contact region are electrically connected to each other through said carrier path silicon layer, and whereby said diffusion region is electrically isolated from said carrier path silicon layer and from said body region as well as from said body contact region, resulting in that any excess carriers generated in said body region are allowed to be withdrawn through said carrier path silicon layer to said body contact region.

16. The silicon-on-insulator structure as claimed in claim 11, wherein said silicide layer is formed to be separated from any parts of said carrier path silicon layer, so that said body region and said body contact region are electrically connected to each other through said carrier path silicon layer, and so that said diffusion region is electrically isolated from said carrier path silicon layer and from said body region as well as from said body contact region, whereby any excess carriers generated in said body region are allowed to be withdrawn through said carrier path silicon layer to said body contact region.

17. A silicon-on-insulator structure in a field effect transistor, said structure comprising:

an insulation region;

a body region of a first conductivity type being selectively formed on said insulation region;

a diffusion region of a second conductivity type being selectively formed on said insulation region and in one side of said body region;

an isolation layer being selectively formed on said insulation region and being bounded with said diffusion region so that said diffusion region is positioned between said body region and said isolation layer;

a body contact region of said first conductivity type being selectively formed on said insulation region and being bounded with said isolation layer so that said body contact region is isolated by said isolation layer from said diffusion region;

at least a carrier path silicon layer of said first conductivity type being selectively formed on said insulation region so that said carrier path silicon layer extends in contact directly with said body contact region, said diffusion region, said isolation layer and said body region, wherein at least a silicide layer is selectively formed on at least said diffusion region and is separated from at least a selected part of said carrier path silicon layer, wherein said selected part of said carrier path silicon layer is in contact directly with said diffusion region so that said body region and said body contact region are electrically connected to each other through said carrier path silicon layer, and so that said diffusion region is electrically isolated from said carrier path silicon layer and from said body region as well as from said body contact region, whereby any excess carriers generated in said body region are allowed to be withdrawn through said carrier path silicon layer to said body contact region; and an anti-silicidation layer made of a material which exhibits no silicidation reaction with a metal under a heat treatment, said anti-silicidation layer extending over at least both said selected part of said carrier path silicon layer and a boundary portion of said diffusion region, which is bounded to and in the vicinity of said selected part of said carrier path silicon layer, so that said silicide layer is selectively formed so as to be separated from at least said selected part of said carrier path silicon layer, and so that said body region and said body contact region are electrically connected to each other through said carrier path silicon layer, and further so that said diffusion region is electrically isolated from said carrier path silicon layer and from said body region as well as from said body contact region, whereby any excess carriers generated in said body region are allowed to be withdrawn through said carrier path silicon layer to said body contact region.

18. The silicon-on-insulator structure as claimed in claim 17, further comprising an anti-silicidation layer made of a material which exhibits no silicidation reaction with a metal under a heat treatment, said anti-silicidation layer extending over both an entire part of said carrier path silicon layer and boundary portions of said diffusion region and body contact regions, which are bounded to and in the vicinity of said carrier path silicon layer, so that said silicide layer is selectively formed so as to be separated from said entire part of said carrier path silicon layer, and so that said body region and said body contact region are electrically connected to each other through said carrier path silicon layer, and further so that said diffusion region is electrically isolated from said carrier path silicon layer and from said body region as well as from said body contact region, whereby any excess carriers generated in said body region are allowed to be withdrawn through said carrier path silicon layer to said body contact region.

19. The silicon-on-insulator structure as claimed in claim 17, wherein said anti-silicidation layer is made of insulator.

20. A silicon-on-insulator structure in a semiconductor device, said structure comprising:

an insulation region;

a first silicon region of a first conductivity type being selectively formed on said insulation region;

a second silicon region of a second conductivity type being selectively formed on said insulation region and in one side of said first silicon region;

an isolation layer being selectively formed on said insulation region and being bounded with said second silicon region so that said second silicon region is positioned between said first silicon region and said isolation layer;

a third silicon region of said first conductivity type being selectively formed on said insulation region and being bounded with said isolation layer so that said third silicon region is isolated by said isolation layer from said second silicon region; and at least a carrier path silicon layer of said first conductivity type being selectively formed on said insulation region so that said carrier path silicon layer extends in contact directly with said third silicon region, said second silicon region, said isolation layer and said first silicon region, wherein an anti-silicidation layer made of a material which exhibits no silicidation reaction with a metal under a heat treatment extends over at least both said selected part of said carrier path silicon layer and a boundary portion of said second silicon region, which is bounded to and in the vicinity of said selected part of said carrier path silicon layer, and wherein a silicide layer with said metal is selectively formed so as to be separated from at least said selected pan of said carrier path silicon layer, so that said first and third silicon regions are electrically connected to each other through said carrier path silicon layer, and further so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

21. The silicon-on-insulator structure as claimed in claim 20, further comprising:

an insulation film being selectively provided on said first silicon region; and a control electrode provided on said insulation film and over said first silicon region.

22. The silicon-on-insulator structure as claimed in claim 21, further comprising a lightly doped silicon region of said second conductivity type having a lower impurity concentration than an impurity concentration of said second silicon region, and said lightly doped silicon region being provided on said insulation region and between said first silicon region and said second silicon region, whereby said carrier path silicon layer is partially in contact with said lightly doped silicon region but is electrically isolated from said lightly doped silicon region.

23. The silicon-on-insulator structure as claimed in claim 22, further comprising a side wall insulation film being provided on a side wall of said control electrode and on a top surface of said lightly doped silicon region.

24. The silicon-on-insulator structure as claimed in claim 20, wherein said silicide layer is formed on both said third silicon region and said second silicon region, and said silicide layer is separated from at least said selected part of said carrier path silicon layer, so that said first and third silicon regions are electrically connected to each other through said carrier path silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

25. The silicon-on-insulator structure as claimed in claim 20, wherein said silicide layer is formed on both said third silicon region and said second silicon region as well as on said carrier path silicon layer except for said selected part thereof so that said silicide layer is separated from said selected part of said carrier path silicon layer, whereby said first and third silicon regions are electrically connected to each other through said carrier path silicon layer, and whereby said second silicon region is electrically isolated from said carrier path silicon layer and from said first silicon region as well as from said third silicon region, resulting in that any excess carriers generated in said first silicon region are allowed to be withdrawn through said carrier path silicon layer to said third silicon region.

26. The silicon-on-insulator structure as claimed in claim 20, wherein said silicide layer is formed to be separated from any parts of said carrier path silicon layer, so that said first and third silicon regions are electrically connected to each other through said carrier path silicon layer, and so that said second silicon region is electrically isolated from said carrier path silicon layer and from said first silicon region as well as from said third silicon legion, whereby any excess carriers generated in said first silicon region arc allowed to be withdrawn through said carrier path silicon layer to said third silicon region.

27. The silicon-on-insulator structure as claimed in claim 20, wherein said anti-silicidation layer extends over both an entire part of said carrier path silicon layer and boundary portions of said second and third silicon regions, which are bounded to and in the vicinity of said carrier path silicon layer, so that said silicide layer is selectively formed so as to be separated from said entire part of said carrier path silicon layer, and so that said first and third silicon regions are electrically connected to each other through said carrier path silicon layer, and further so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

28. The silicon-on-insulator structure as claimed in claim 27, wherein said anti-silicidation layer is made of insulator.

29. The silicon-on-insulator structure as claimed in claim 28, wherein said insulator is silicon dioxide.

30. A silicon-on-insulator structure in a semiconductor device, said structure comprising:

an insulation region;

a first silicon region of a first conductivity type being selectively formed on said insulation region;

a second silicon region of a second conductivity type being selectively formed on said insulation region and in one side of said first silicon region;

an isolation layer being selectively formed on said insulation region and being bounded with said second silicon region so that said second silicon region is positioned between said first silicon region and said isolation layer;

a third silicon region of said first conductivity type being selectively formed on said insulation region and being bounded with said isolation layer so that said third silicon region is isolated by said isolation layer from said second silicon region;

at least a carrier path silicon layer of said first conductivity type being selectively formed on said insulation region so that said carrier path silicon layer extends in contact directly with said third silicon region, said second silicon region, said isolation layer and said fourth silicon region, wherein at least a silicide layer is selectively formed on at least said second silicon region and is separated from at least a selected part of said carrier path silicon layer, wherein said selected part of said carrier path silicon layer is in contact directly with said second silicon region so that said first and third silicon regions are electrically connected to each other through said carrier path silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region, wherein said silicide layer is formed on both said third silicon region and said second silicon region, and said silicide layer is separated from at least said selected part of said carrier path silicon layer, so that said first and third silicon regions are electrically connected to each other through said carrier path silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

31. The silicon-on-insulator structure as claimed in claim 30, further comprising:

an insulation film being selectively provided on said first silicon region; and a control electrode provided on said insulation film and over said first silicon region.

32. The silicon-on-insulator structure as claimed in claim 31, further comprising a lightly doped silicon region of said second conductivity type having a lower impurity concentration than an impurity concentration of said second silicon region, and said lightly doped silicon region being provided on said insulation region and between said first silicon region and said second silicon region, whereby said carrier path silicon layer is partially in contact with said lightly doped silicon region but is electrically isolated from said lightly doped silicon region.

33. The silicon-on-insulator structure as claimed in claim 32, further comprising a side wall insulation film being provided on a side wall of said control electrode and on a top surface of said lightly doped silicon region.

34. A silicon-on-insulator structure in a semiconductor device, said structure comprising:

an insulation region;

a first silicon region of a first conductivity type being selectively formed on said insulation region;

a second silicon region of a second conductivity type being selectively formed on said insulation region and in one side of said first silicon region;

an isolation layer being selectively formed on said insulation region and being bounded with said second silicon region so that said second silicon region is positioned between said first silicon region and said isolation layer;

a third silicon region of said first conductivity type being selectively formed on said insulation region and being bounded with said isolation layer so that said third silicon region is isolated by said isolation layer from said second silicon region;

at least a carrier path silicon layer of said first conductivity type being selectively formed on said insulation region so that said carrier path silicon layer extends in contact directly with said third silicon region, said second silicon region, said isolation layer and said fourth silicon region, wherein at least a silicide layer is selectively formed on at least said second silicon region and is separated from at least a selected part of said carrier path silicon layer, wherein said selected part of said carrier path silicon layer is in contact directly with said second silicon region so that said first and third silicon regions are electrically connected to each other through said carrier path silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region, wherein said silicide layer is formed on both said third silicon region and said second silicon region as well as on said carrier path silicon layer except for said selected part thereof so that said silicide layer is separated from said selected part of said carrier path silicon layer, whereby said first and third silicon regions are electrically connected to each other through said carrier path silicon layer, and whereby said second silicon region is electrically isolated from said carrier path silicon layer and from said first silicon region as well as from said third silicon region, resulting in that any excess carriers generated in said first silicon region are allowed to be withdrawn through said carrier path silicon layer to said third silicon region.

35. The silicon-on-insulator structure as claimed in claim 30, wherein said silicide layer is formed to be separated from any parts of said carrier path silicon layer, so that said first and third silicon regions are electrically connected to each other through said carrier path silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

36. A silicon-on-insulator structure in a semiconductor device, said structure comprising:

an insulation region;

a first silicon region of a first conductivity type being selectively formed on said insulation region;

a second silicon region of a second conductivity type being selectively formed on said insulation region and in one side of said first silicon region;

an isolation layer being selectively formed on said insulation region and being bounded with said second silicon region so that said second silicon region is positioned between said first silicon region and said isolation layer;

a third silicon region of said first conductivity type being selectively formed on said insulation region and being bounded with said isolation layer so that said third silicon region is isolated by said isolation layer from said second silicon region;

at least a carrier path silicon layer of said first conductivity type being selectively formed on said insulation region so that said carrier path silicon layer extends in contact directly with said third silicon region, said second silicon region, said isolation layer and said fourth silicon region, wherein at least a silicide layer is selectively formed on at least said second silicon region and is separated from at least a selected part of said carrier path silicon layer, wherein said selected part of said carrier path silicon layer is in contact directly with said second silicon region so that said first and third silicon regions are electrically connected to each other through said carrier path, silicon layer, and so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region; and an anti-silicidation layer made of a material which exhibits no silicidation reaction with a metal under a heat treatment, said anti-silicidation layer extending over at least both said selected part of said carrier path silicon layer and a boundary portion of said second silicon region, which is bounded to an in the vicinity of said selected part of said carrier path silicon layer, so that said silicide layer is selectively formed so as to be separated from at least said selected part of said carrier path silicon layer, and so that said first and third silicon regions are electrically connected to each other through said carrier path silicon layer, and further so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

37. The silicon-on-insulator structure as claimed in claim 36, further comprising an anti-silicidation layer made of a material which exhibits no silicidation reaction with a metal under a heat treatment, said anti-silicidation layer extending over both an entire part of said carrier path silicon layer and boundary portions of said second and third silicon regions, which are bounded to and in the vicinity of said carrier path silicon layer, so that said silicide layer is selectively formed so as to be separated from said entire part of said carrier path silicon layer, and so that said first and third silicon regions are electrically connected to each other through said carrier path silicon layer, and further so that said second silicon region is electrically isolated from said carrier path silicon layer and from said first silicon region as well as from said third silicon region, whereby any excess carriers generated in said first silicon region are allowed to be withdrawn through said carrier path silicon layer to said third silicon region.

38. The silicon-on-insulator structure as claimed in claim 36, wherein said anti-silicidation layer is made of insulator.

39. An SOI-MOS field effect transistor comprising:
   a silicon substrate;
   a buried silicon oxide layer provided on said silicon substrate;
   a monocrystal silicon layer provided on said buried silicon oxide layer to form a silicon-on-insulator structure, said monocrystal silicon layer being surrounded by field oxide films, and said monocrystal silicon layer further comprising;
   a body region of a first conductivity type being selectively formed on said buried silicon oxide layer;
   a first diffusion region of a second conductivity type acting as one of source and drain regions and being selectively formed on said buried silicon oxide layer and in one side of said body region;
   a second diffusion region of said second conductivity type acting as another one of said source and drain regions and being selectively formed on said buried silicon oxide layer and in an opposite side of said channel region so that said body region is positioned between said first and second diffusion regions;
   an isolation layer being selectively formed on said buried silicon oxide layer and being bounded with said first diffusion region so that said first diffusion region is positioned between said body region and said isolation layer;
   a body contact region of said first conductivity type being selectively formed on said buried silicon oxide layer and being bounded with said isolation layer so that said body region is isolated by said isolation layer from said first diffusion region; and
   a pair of carrier path regions of said first conductivity type being selectively formed on said buried silicon oxide layer so that said carrier path regions extend along first opposite sides of said monocrystal silicon layer in a channel length direction, where said first opposite sides are distanced from each other in a body width direction perpendicular to said channel length direction, and said carrier path regions being bounded with said field oxide films, whereby each of said carrier path regions is in contact directly with said body contact region, said first and second diffusion regions, said isolation layer and said body contact region;
   a gate insulation film being selectively provided on said channel region; and
   a gate electrode provided on said gate insulation film and over said channel region,
   wherein anti-silicidation layers made of a material which exhibits no silicidation reaction with a metal under a heat treatment extend over at least both said selected parts of said carrier path regions and boundary portions of said first and second diffusion regions, which ate bounded to and in the vicinity of said selected parts of said carrier path regions, and
   wherein a silicide layer with said metal is selectively formed so as to be separated from at least said selected part of each of said carrier path regions, so that said channel region and said body contact region are electrically connected to each other through said carrier path regions, and further so that said first and second diffusion regions are electrically isolated from said carrier path regions and from said channel region as well as from said body contact region, whereby any excess carriers generated in said channel region are allowed to be withdrawn through said carrier path regions to said body contact region.

40. The SOI-MOS field effect transistor as claimed in claim 39, further comprising:
   an inter-layer insulator which covers said gate electrode, said first and second diffusion regions, said isolation layer, said body contact region, and said carrier path regions;
   a contact layer formed in a contact hole formed in said inter-layer insulator and over said body contact region so that said contact layer is in contact with said body contact region; and
   an interconnection layer extending over said inter-layer insulator and also being connected with said contact layer so that said interconnection layer is electrically connected through said contact layer to said body contact region.

41. The SOI-MOS field effect transistor as claimed in claim 40, further comprising lightly doped silicon regions of said second conductivity type having a lower impurity concentration than impurity concentrations of said first and second diffusion regions, and said lightly doped silicon regions being provided on said buried silicon oxide layer and between said channel region and said first diffusion region and between said body region and said second diffusion region, whereby said carrier path regions are partially in contact with said lightly doped silicon regions but are electrically isolated from said lightly doped silicon regions.

42. The SOI-MOS field effect transistor as claimed in claim 41, further comprising side wall insulation films being provided on opposite side walls of said gate electrode and on top surfaces of said lightly doped silicon regions.

43. The SOI-MOS field effect transistor as claimed in claim 39, wherein said silicide layers are formed on both said body contact region and said first and second diffusion regions, and said silicide layers are separated from at least said selected parts of said carrier path regions, so that said body region and said body contact region are electrically connected to each other through said carrier path regions, and so that said first and second diffusion regions are electrically isolated from said carrier path region and from said body region as well as from said body contact region, whereby any excess carriers generated in said body region are allowed to be withdrawn through said carrier path region to said body contact region.

44. The SOI-MOS field effect transistor as claimed in claim 39, wherein said silicide layers are formed on both said body contact region and said first and second diffusion regions as well as on said carrier path regions except for said selected parts thereof so that said silicide layers are separated from said selected parts of said carrier path regions, whereby said body region and said body contact region are electrically connected to each other through said carrier path regions, and whereby said first and second diffusion regions are electrically isolated from said carrier path regions and from said body region as well as from said body contact region, resulting in that any excess carriers generated in said body region are allowed to be withdrawn through said carrier path regions to said body contact region.

45. The SOI-MOS field effect transistor as claimed in claim 39, wherein said silicide layers are formed to be separated from any parts of each of said carrier path regions, so that said body region and said body contact region are electrically connected to each other through said carrier path region, and so that said first and second diffusion regions are electrically isolated from said carrier path region and from said body region as well as from said body contact region, whereby any excess carriers generated in said body region are allowed to be withdrawn through said carrier path regions to said body contact region.

46. The SOI-MOS field effect transistor as claimed in claim 39, wherein said anti-silicidation layers extend over both entire parts of said carrier path regions and boundary portions of said first and second diffusion regions and said body contact regions, which are bounded to and in the vicinity of said carrier path regions, so that said silicide layers are selectively formed so as to be separated from said entire parts of said carrier path regions, and so that said body region and said body contact region are electrically connected to each other through said carrier path regions, and further so that said first and second diffusion regions are electrically isolated from said carrier path regions and from said body region as well as from said body contact region, whereby any excess carriers generated in said body region are allowed to be withdrawn through said carrier path regions to said body contact region.

47. The SOI-MOS field effect transistor as claimed in claim 46, wherein said anti-silicidation layers are made of insulator.

48. The SOI-MOS field effect transistor as claimed in claim 47, wherein said insulator is silicon dioxide.

49. An SOI-MOS field effect transistor comprising:
a silicon substrate;
a buried silicon oxide layer provided on said silicon substrate;
a monocrystal silicon layer provided on said buried silicon oxide layer to form a silicon-on-insulator structure, said monocrystal silicon layer being surrounded by field oxide films, and said monocrystal silicon layer further comprising:
a body region of a first conductivity type being selectively formed on said buried silicon oxide layer;
a first diffusion region of a second conductivity type acting as one of source and drain regions and being selectively formed on said buried silicon oxide layer and in one side of said body region;
a second diffusion region of said second conductivity type acting as another one of said source and drain regions and being selectively formed on said buried silicon oxide layer and in an opposite side of said channel region so that said body region is positioned between said first and second diffusion regions;
an isolation layer being selectively formed on said buried silicon oxide layer and being bounded with said first diffusion region so that said first diffusion region is positioned between said channel region and said isolation layer;
a body contact region of said first conductivity type being selectively formed on said buried silicon oxide layer and being bounded with said isolation layer so that said body contact region is isolated by said isolation layer from said first diffusion region; and
a pair of carrier path regions of said first conductivity type being selectively formed on said buried silicon oxide layer so that said carrier path regions extend along first opposite sides of said monocrystal silicon layer in a channel length direction, where said first opposite sides are distanced from each other in a channel width direction perpendicular to said channel length direction, and said carrier path regions being bounded with said field oxide films, whereby each of said carrier path regions is in contact directly with said body contact region, said first and second diffusion regions, said isolation layer and said body region;
a gate insulation film being selectively provided on said body region;
a gate electrode provided on said gate insulation film and over said body region;
lightly doped silicon regions of said second conductivity type having a lower impurity concentration than impurity concentrations of said first and second diffusion regions, and said lightly doped silicon regions being provided on said buried silicon oxide layer and between said body region and said first diffusion region and between said body region and said second diffusion region;
side wall insulation films being provided on opposite side walls of said gate electrode and on top surfaces of said lightly doped silicon regions;

an inter-layer insulator which covers said gate electrode, said first and second diffusion regions, said isolation layer, said body contact region, and said carrier path regions;

a contact layer formed in a contact hole formed in said inter-layer insulator and over said body contact region so that said contact layer is in contact with said body contact region; and an interconnection layer extending over said inter-layer insulator and also being connected with said contact layer so that said interconnection layer is electrically connected through said contact layer to said body contact region, wherein anti-silicidation layers made of a material which exhibits no silicidation reaction with a metal under a heat treatment extend over at least both said carrier path regions and boundary portions of said first and second diffusion regions, which are bounded to and in the vicinity of said carrier path regions, and wherein silicide layers with said metal are selectively formed on both said body contact region and said first and second diffusion regions, and said silicide layers are separated from said carrier path regions, so that said body region and said body contact region are electrically connected to each other through said carrier path regions, and further so that said first and second diffusion regions are electrically isolated from said carrier path regions and from said channel region as well as from said body contact region, whereby any excess carriers generated in said channel region are allowed to be withdrawn through said carrier path regions to said body contact region.

50. The SOI-MOS field effect transistor as claimed in claim 49, wherein said anti-silicidation layers are made of insulator.

51. The SOI-MOS field effect transistor as claimed in claim 50, wherein said insulator is silicon dioxide.

52. A gate array semiconductor device having a plurality of SOI-MOS field effect transistors being gate-arrayed, each of said SOI-MOS field effect transistors comprising:

a silicon substrate;

a buried silicon oxide layer provided on said silicon substrate;

a monocrystal silicon layer provided on said buried silicon oxide layer to form a silicon-on-insulator structure, said monocrystal silicon layer being surrounded by field oxide films, and said monocrystal silicon layer further comprising:

a body region of a first conductivity type being selectively formed on said buried silicon oxide layer;

a first diffusion region of a second conductivity type acting as one of source and drain regions and being selectively formed on said buried silicon oxide layer and in one side of said body region;

a second diffusion region of said second conductivity type acting as another one of said source and drain regions and being selectively formed on said buried silicon oxide layer and in an opposite side of said channel region so that said body region is positioned between said first and second diffusion regions;

an isolation layer being selectively formed on said buried silicon oxide layer and being bounded with said first diffusion region so that said first diffusion region is positioned between said body region and said isolation layer;

a body contact region of said first conductivity type being selectively formed on said buried silicon oxide layer and being bounded with said isolation layer so that said body contact region is isolated by said isolation layer from said first diffusion region; and a pair of carrier path regions of said first conductivity type being selectively formed on said buried silicon oxide layer so that said carrier path regions extend along first opposite sides of said monocrystal silicon layer in a channel length direction, where said first opposite sides are distanced from each other in a channel width direction perpendicular to said channel length direction, and said carrier path regions being bounded with said field oxide films, whereby each of said carrier path regions is in contact directly with said body contact region, said first and second diffusion regions, said isolation layer and said body region;

a gate insulation film being selectively provided on said body region; and a gate electrode provided on said gate insulation film and over said body region, wherein anti-silicidation layers made of a material which exhibits no silicidation reaction with a metal under a heat treatment extend over at least both said selected parts of said carrier path regions and boundary portions of said first and second diffusion regions, which are bounded to and in the vicinity of said selected parts of said carrier path regions, and wherein a silicide layer with said metal is selectively formed so as to be separated from at least said selected part of each of said carrier path regions, so that said channel region and said body contact region are electrically connected to each other through said carrier path regions, and further so that said first and second diffusion regions are electrically isolated from said carrier path regions and from said channel region as well as from said body contact region, whereby any excess carriers generated in said body region are allowed to be withdrawn through said carrier path regions to said body contact region.

53. The gate array semiconductor device as claimed in claim 52, wherein each of said SOI-MOS field effect transistors further comprise:

an inter-layer insulator which covers said gate electrode, said first and second diffusion regions, said isolation layer, said body contact region, and said carrier path regions;

a contact layer formed in a contact hole formed in said inter-layer insulator and over said body contact region so that said contact layer is in contact with said body contact region; and an interconnection layer extending over said inter-layer insulator and also being connected with said contact layer so that said interconnection layer is electrically connected through said contact layer to said body contact region.

54. The gate array semiconductor device as claimed in claim 53, wherein each of said SOI-MOS field effect transistors further comprises lightly doped silicon regions of said second conductivity type having a lower impurity concentrations than impurity concentrations of said first and second diffusion regions, and said lightly doped silicon regions being provided on said buried silicon oxide layer and between said body region and said first diffusion region and between said body region and said second diffusion region, whereby said carrier path regions are partially in contact with said lightly doped silicon regions but are electrically isolated from said lightly doped silicon regions.

55. The gate array semiconductor device as claimed in claim 54, wherein each of said SOI-MOS field effect transistors further comprises side wall insulation films being provided on opposite side walls of said gate electrode and on top surfaces of said lightly doped silicon regions.

56. The gate array semiconductor device as claimed in claim 52, wherein said silicide layers are formed on both said body contact region and said first and second diffusion regions, and said silicide layers are separated from at least said selected parts of said carrier path regions, so that said body region and said body contact region are electrically connected to each other through said carrier path regions, and so that said first and second diffusion regions are electrically isolated from said carrier path region and from said body region as well as from said body contact region, whereby any excess carriers generated in said body region are allowed to be withdrawn through said carrier path region to said body contact region.

57. The gate array semiconductor device as claimed in claim 52, wherein said silicide layers are formed on both said body contact region and said first and second diffusion regions as well as on said carrier path regions except for said selected parts thereof so that said silicide layers are separated from said selected parts of said carrier path regions, whereby said body region and said body contact region are electrically connected to each other through said carrier path regions, and whereby said first and second diffusion regions are electrically isolated from said carrier path regions and from said body region as well as from said body contact region, resulting in that any excess carriers generated in said body region are allowed to be withdrawn through said carrier path regions to said body contact region.

58. The gate array semiconductor device as claimed in claim 52, wherein said suicide layers are formed to be separated from any parts of each of said carrier path regions, so that said body region and said body contact region are electrically connected to each other through said carrier path region, and so that said first and second diffusion regions are electrically isolated from said carrier path region and from said body region as well as from said body contact region, whereby any excess carriers generated in said body region are allowed to be withdrawn through said carrier path regions to said body contact region.

59. The gate array semiconductor device as claimed in claim 52, wherein said anti-silicidation layers extend over both entire parts of said carrier path regions and boundary portions of said first and second diffusion regions and said body contact regions, which are bounded to and in the vicinity of said carrier path regions, so that said silicide layers are selectively formed so as to be separated from said entire parts of said carrier path regions, and so that said body region and said body contact region are electrically connected to each other through said carrier path regions, and further so that said first and second diffusion regions are electrically isolated from said carrier path regions and from said body region as well as from said body contact region, whereby any excess carriers generated in said body region are allowed to be withdrawn through said carrier path regions to said body contact region.

60. The gate array semiconductor device as claimed in claim 59, wherein said anti-silicidation layers are made of insulator.

61. The gate array semiconductor device as claimed in claim 60, wherein said insulator is silicon dioxide.

* * * * *